United States Patent
Lohe et al.

(10) Patent No.: US 11,476,676 B1
(45) Date of Patent: Oct. 18, 2022

(54) SYSTEMS AND METHODS FOR BATTERY MANAGEMENT FOR ELECTRIC AIRCRAFT BATTERIES

(71) Applicant: BETA AIR, LLC, South Burlington, VT (US)

(72) Inventors: Braedon Lohe, Essex Junction, VT (US); Cullen Jemison, Winooski, VT (US); Andrew Giroux, Georgia, VT (US); Tom Hughes, South Burlington, VT (US)

(73) Assignee: BETA AIR, LLC, South Burlington, VT (US)

(*) Notice: Subject to any disclaimer, the term of this patent is extended or adjusted under 35 U.S.C. 154(b) by 0 days.

(21) Appl. No.: 17/528,896

(22) Filed: Nov. 17, 2021

(51) Int. Cl.
  *H02J 7/00* (2006.01)
  *B60L 58/12* (2019.01)
  *B64D 27/24* (2006.01)

(52) U.S. Cl.
  CPC .......... *H02J 7/00032* (2020.01); *B60L 58/12* (2019.02); *B64D 27/24* (2013.01); *H02J 7/007* (2013.01); *H02J 7/0013* (2013.01); *H02J 7/0047* (2013.01); *B60L 2200/10* (2013.01); *B64D 2221/00* (2013.01); *H02J 2310/44* (2020.01)

(58) Field of Classification Search
  None
  See application file for complete search history.

(56) References Cited

U.S. PATENT DOCUMENTS

| | | |
|---|---|---|
| 9,242,728 B2 | 1/2016 | Morrison |
| 10,328,805 B1 | 6/2019 | Wyrobek et al. |
| 10,899,445 B2 | 1/2021 | Augugliaro et al. |
| 11,065,979 B1 | 7/2021 | Demont et al. |
| 11,074,827 B2 | 7/2021 | Choi et al. |
| 2016/0107758 A1* | 4/2016 | Esteyne .................... H02J 1/08 318/139 |
| 2018/0086472 A1 | 3/2018 | Gore |
| 2018/0290556 A1* | 10/2018 | Demont .............. H02J 7/00036 |

(Continued)

OTHER PUBLICATIONS

Tarhan et al., Hybrid battery management system design for electric aircraft, Jun. 21, 2021.

(Continued)

*Primary Examiner* — Jared Fureman
*Assistant Examiner* — Aqeel H Bukhari
(74) *Attorney, Agent, or Firm* — Caldwell Intellectual Property Law

(57) ABSTRACT

A system for battery management for electric aircraft batteries includes an energy storage system configured to provide energy to the electric aircraft via a power supply connection, the energy storage system including: a battery pack, a sensor configured to detect a condition parameter of the battery pack and generate a battery datum based on the condition parameter, a pack monitoring unit (PMU) configured to receive the battery datum, and a high voltage disconnect configured to terminate the power supply connection between the battery pack and the electric aircraft; a high voltage bus electrically connected to the high voltage disconnect; a primary functional display configured to display information based on battery datum; and a first controller area network (CAN) bus and a second CAN bus communicatively connected to the PMU, the high voltage bus, and the primary functional display.

20 Claims, 10 Drawing Sheets

(56) References Cited

U.S. PATENT DOCUMENTS

| | | |
|---|---|---|
| 2020/0218288 A1 | 7/2020 | Johnson et al. |
| 2020/0274371 A1 | 8/2020 | Kirleis et al. |
| 2020/0307390 A1* | 10/2020 | Clark .................. B64C 39/024 |
| 2021/0170908 A1* | 6/2021 | Villanueva .......... H01M 10/625 |
| 2021/0223794 A1 | 7/2021 | Enke |
| 2021/0253246 A1 | 8/2021 | Tibbitts et al. |

OTHER PUBLICATIONS

Jung et al., Flight Time Estimation for Continuous Surveillance Missions Using a Multirotor UAV, Mar. 5, 2019.
Mian S, A Novel Battery Management & Charging Solution for Autonomous UAV Systems, Apr. 30, 2018.

* cited by examiner

US 11,476,676 B1

SYSTEMS AND METHODS FOR BATTERY MANAGEMENT FOR ELECTRIC AIRCRAFT BATTERIES

FIELD OF THE INVENTION

The present invention generally relates to the field of electric aircraft batteries. In particular, the present invention is directed to systems and methods for battery management for electric aircraft batteries.

BACKGROUND

The burgeoning of electric vertical take-off and landing (eVTOL) aircraft technologies promises an unprecedented forward leap in energy efficiency, cost savings, and the potential of future autonomous and unmanned aircraft. However, the technology of eVTOL aircraft is still lacking in crucial areas of energy source solutions.

SUMMARY OF THE DISCLOSURE

In an aspect of the present disclosure, a system for battery management for electric aircraft batteries includes an energy storage system configured to provide energy to the electric aircraft via a power supply connection, the energy storage system including: a battery pack, a sensor configured to detect a condition parameter of the battery pack and generate a battery datum based on the condition parameter, a pack monitoring unit (PMU) configured to receive the battery datum, and a high voltage disconnect configured to terminate the power supply connection between the battery pack and the electric aircraft; a high voltage bus electrically connected to the high voltage disconnect; a primary functional display configured to display information based on battery datum; and a first controller area network (CAN) bus and a second CAN bus communicatively connected to the PMU, the high voltage bus, and the primary functional display; wherein the first CAN bus is configured to electrically isolate from the second CAN bus.

In another aspect of the present disclosure, a method for battery management for electric aircraft batteries includes receiving, at a first pack monitoring unit (PMU) from a first sensor on a battery pack, a first battery datum based on a first condition parameter of the battery pack; transmitting the first battery datum from the first PMU to a first flight controller; transmitting the first battery datum from flight controller to a primary functional display; and displaying the first battery datum on the primary functional display.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for battery management for electric aircraft batteries. In an embodiment, a system for battery management may include one or more battery packs communicatively connected to a first controller area network (CAN) bus and a second CAN bus via one or more pack monitoring units (PMU). The PMUs may be configured to transmit battery datum through the first and second CAN buses to a flight controller. The one or more battery packs may also be electrically connected to the first and second CAN buses through a high voltage bus to power an electric aircraft and/or subsystems of an electric aircraft. A recharge controller may be communicatively connected to the first and second CAN buses to control charging of the one or more battery packs. Exemplary embodiments illustrating aspects of the present disclosure are described below in the context of several specific examples.

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Figure 1:
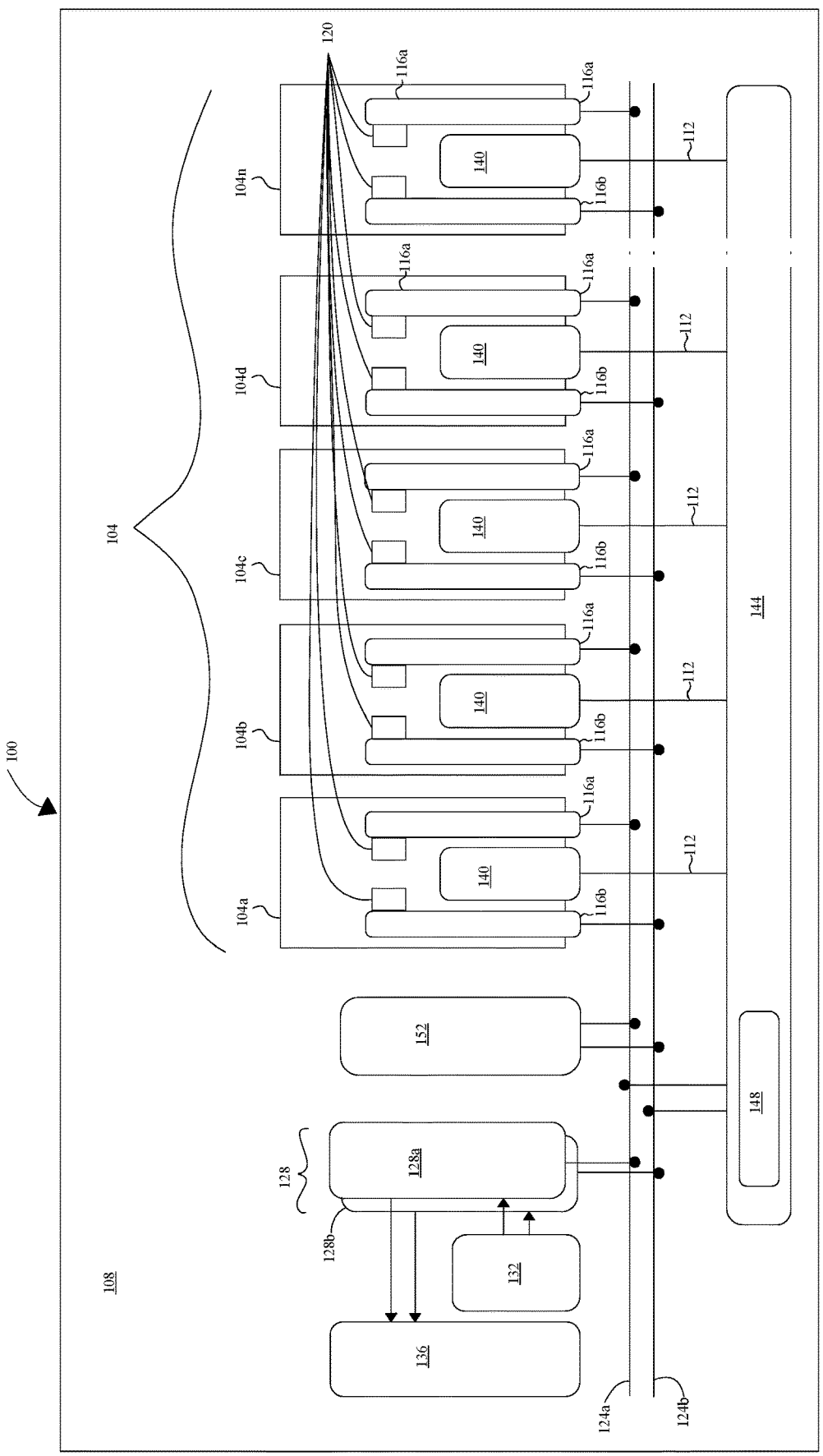
FIG. 1 is a block diagram of a system for battery management for electric aircraft batteries.

Referring now to FIG. 1, an embodiment of a system 100 for battery management for electric aircraft batteries is illustrated. System 100 includes a battery pack 104 configured to provide energy to the electric aircraft 108 via a power supply connection 112. As discussed below, battery pack 104 may include a battery storage system comprising one or more battery packs, such as battery packs 104a-n. In one or more embodiments, battery pack 104 may include a battery module, as discussed below, which may be configured to provide energy to an electric aircraft 108 via a power supply connection 112. For the purposes of this disclosure, a "power supply connection" is an electrical and/or physical communication between battery pack 104 and/or subcomponent of battery pack 104, such as battery module, and electric aircraft 108 and/or one or more components and/or systems thereof that powers electric aircraft 108 and/or electric aircraft subsystems for operation. In one or more embodiments, battery pack 104 may include a plurality of battery modules, which may also be referred to as sub-packs. In one or more embodiments, each battery module may include a battery cell.

Still referring to FIG. 1, battery pack 104 includes a pack monitoring unit (PMU) 116. PMU 116 may be configured to collect a condition parameter of the battery pack 104. For the purposes of this disclosure, a "condition parameter" is detected electrical or physical input and/or phenomenon related to a state of a battery pack. A state of a battery pack may include detectable information related to, for example, a temperature, a moisture level, a humidity, a voltage, a current, vent gas, vibrations, chemical content, or other measurable characteristics of battery pack 104 or components thereof, such as battery module 104 and/or battery cell 304. PMU 116 may include a sensor 120. Sensor 120 is configured to detect condition parameter of battery pack 104 and generate a battery datum based on the condition parameter. As used in this disclosure, a "sensor" is a device that is configured to detect an input and/or a phenomenon and transmit information and/or datum related to the detection; sensor may include an electronic sensor, which transmits information and/or datum electronically. As used in this disclosure, "battery datum" is an element of data encoding one or more condition parameters in an electrical signal such as a binary, analog, pulse width modulated, or other signal. For example, and without limitation, sensor 120 may transduce a detected phenomenon and/or characteristic of battery pack 104, such as, and without limitation, temperature, voltage, current, pressure, temperature, moisture level, and the like, into a sensed signal. A sensor may include one or more sensors and may generate a sensor output signal, which transmits information and/or datum related to a sensor detection. A sensor output signal may include any signal form described in this disclosure, for example digital, analog, optical, electrical, fluidic, and the like. In some cases, a sensor, a circuit, and/or a controller may perform one or more signal processing steps on a signal. For instance, a sensor, circuit, and/or controller may analyze, modify, and/or synthesize a signal in order to improve the signal, for instance by improving transmission, storage efficiency, or signal to noise ratio. For example, and without limitation, sensor 120 may detect and/or measure a condition parameter, such as a temperature, of battery module 104. In one or more embodiments, a condition state of battery pack 104 may include a condition state of a battery module 104 and/or battery cell 304. Additional disclosure related to a pack monitoring system can be found in U.S. patent application Ser. No. XX/XX,XX entitled "A MODULE MONITOR UNIT FOR AN ELECTRIC AIRCRAFT BATTERY PACK AND METHODS OF USE", entirety of which in incorporated herein by reference. Sensor 120 may include one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, bolometers, and the like. Sensor 120 may be a contact or a non-contact sensor. For example, and without limitation, sensor 120 may be connected to battery module and/or battery cell of battery pack 104. In other embodiments, sensor 120 may be remote to battery module and/or battery cell. PMU 116 may include a pressure sensor, a real time clock (RTC) sensor that is used to track the current time and date, a humidity sensor, an accelerometer/IMU, or other sensor.

With continued reference to FIG. 1, PMU 116 is configured to receive battery datum from sensor 120. PMU 116 may be configured to process battery datum. In some embodiments, PMU 116 may not include sensor 120, but the sensor 120 may be communicatively connected to the PMU 116. As used herein, "communicatively connected" is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. PMU 116 may include a sensor suite 400 (shown in FIG. 4) having a plurality of sensors. In one or more embodiments, PMU 116 may be integrated into battery pack 104 in a portion of battery pack 104 or a subassembly thereof. One of ordinary skill in the art will appreciate that there are various areas in and on a battery pack and/or subassemblies thereof that may include PMU 116. In one or more embodiments, PMU 116 may be disposed directly over, adjacent to, facing, and/or near a battery module and specifically at least a portion of a battery cell.

Still referring to FIG. 1, in one or more embodiments, PMU 116 may include and/or be communicatively connected to a module monitor unit (MMU), which may be mechanically connected and communicatively connected to battery module. In one or more embodiments, MMU may be communicatively connected to sensor 120 and configured to receive battery datum from sensor 120. MMU may then be configured to transmit battery datum and/or information based on battery datum to PMU 116. PMU 116 may include and/or be communicatively connected to a controller, which is configured to receive battery datum and/or information based on battery datum from PMU 116. PMU 116 may include a plurality of PMUs to create redundancy so that, if one PMU fails or malfunctions, another PMU may still operate properly. For example, PMU 116 may include PMUs 116a,b. PMUs 116a,b may be communicatively connected to the same of one or more of sensor 120. In some embodiments, PMU 116a may be connected to one or more of sensor 120 and PMU 116b may be connected to other one or more of sensor 120 to create redundancies in case of sensor failure.

With continued reference to FIG. 1, system 100 may include a physical controller area network (CAN) bus 124. A "controller area network bus" or "CAN bus" as used in this disclosure, is a physical vehicle bus unit including a central processing unit (CPU), a CAN controller, and a transceiver designed to allow devices to communicate with each other's applications without the need of a host computer which is located physically at electric aircraft 108. For instance and without limitation, CAN bus 124 may be consistent with disclosure of CAN bus unit in U.S. patent application Ser. No. 17/218,342 and titled "METHOD AND SYSTEM FOR VIRTUALIZING A PLURALITY OF CONTROLLER AREA NETWORK BUS UNITS COMMUNICATIVELY CONNECTED TO AN AIRCRAFT," which is incorporated herein by reference in its entirety. CAN bus 124 may include physical circuit elements that may use, for instance and without limitation, twisted pair, digital circuit elements/FGPA, microcontroller, or the like to perform, without limitation, processing and/or signal transmission processes and/or tasks; circuit elements may be used to implement CAN bus 124 components and/or constituent parts as described in further detail below. CAN bus 124 may include multiplex electrical wiring for transmission of multiplexed signaling. CAN bus 124 may include message-based protocol(s), wherein the invoking program sends a message to a process and relies on that process and its supporting infrastructure to then select and run appropriate programing. CAN bus 124 may include a mechanical connection to electric aircraft 108, wherein the hardware of CAN bus 124 is integrated within the infrastructure of electric aircraft 108.

Still referring to FIG. 1, system 100 may include a flight controller 128, as discussed below. Flight controller 128 may be communicatively connected to PMU 116 and configured to receive data from PMU 116 such as battery datum. Flight controller 128 and PMU 116 may be communicatively connected to CAN bus 124, allowing information to pass to and/or from flight controller 128 and PMU 116 via CAN bus 124. Flight controller 128 may be configured to process battery datum received from PMU 116. In some embodiments, CAN bus 124 may include multiple CAN buses such as CAN buses 124a,b. Flight controller 128 may also include multiple flight controllers such as flight controllers 128a,b. In some embodiments, PMU 116a and flight controller 128a may be communicatively connected via CAN bus 124a. Similarly, PMU 116b and flight controller 128b may be communicatively connected via CAN bus 124b. As discussed above, the redundancy may provide for system 100 to continue functioning if a component, such as PMU 116a, is nonfunctional. CAN bus 124a may be configured to electrically isolate from CAN bus 124b. For example, CAN bus 124a may be configured to electrically connect to CAN bus 124b by a tie breaker and/or a fuse. In some embodiments, PMU 116a,b may be a single unit functioning as two separate PMUs by using an electrically isolated data coupling to connect to CAN bus 124a and/or CAN bus 124b.

Flight controller 128 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Flight controller 128 may include a single computing device operating independently, or may include two or more computing device operating in concert, in parallel, sequentially or the like; two or more computing devices may be included together in a single computing device or in two or more computing devices. Flight controller 128 may interface or communicate with one or more additional devices as described below in further detail via a network interface device. Network interface device may be utilized for connecting flight controller 128 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Flight controller 128 may include but is not limited to, for example, a computing device or cluster of computing devices in a first location and a second computing device or cluster of computing devices in a second location. Flight controller 128 may include one or more computing devices dedicated to data storage, security, distribution of traffic for load balancing, and the like. Flight controller 128 may distribute one or more computing tasks as described below across a plurality of computing devices of computing device, which may operate in parallel, in series, redundantly, or in any other manner used for distribution of tasks or memory between computing devices. Flight controller 128 may be implemented using a "shared nothing" architecture in which data is cached at the worker, in an embodiment, this may enable scalability of system 100 and/or computing device.

With continued reference to FIG. 1, flight controller 128 may be designed and/or configured to perform any method, method step, or sequence of method steps in any embodiment described in this disclosure, in any order and with any degree of repetition. For instance, flight controller 128 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller 128 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, flight controller 128 may be communicatively connected to a pilot input 132. As used in this disclosure, a "pilot input" is defined as any gauge, throttle lever, clutch, dial, control, or any other mechanical or electrical device that is configured to be manipulated by pilot to receive information. As used in this disclosure, a "pilot datum" is an element of information received from a pilot. Pilot input 132 may include a hover and thrust control assembly, a vertical propulsor, a forward propulsor, a throttle lever, a rotating throttle lever, a linear thrust control, a battery shut-off switch, a control stick, an inceptor stick, a collective pitch control, a steering wheel, brake pedals, pedal controls, toggles, and a joystick. Pilot input 132 may include multiple pilot inputs. Pilot input 132 may be consistent with disclosure of inputs in U.S. patent application Ser. No. 17/001,845 and titled "A HOVER AND THRUST CONTROL ASSEMBLY FOR DUAL-MODE AIRCRAFT," which is incorporated herein in its entirety by reference. Pilot input 132 may receive input from pilot through standard I/O interface such as ISA (Industry Standard Architecture), PCI (Peripheral Component Interconnect) Bus, and the like. Pilot input 132 may receive input from user through standard I/O operation. In one embodiment, pilot input 132 may further receive input from pilot through optical tracking of motion. In one embodiment, pilot input 132 may further receive input from pilot through voice-commands. Pilot input 132 may further use event-driven programming, where event listeners are used to detect input from pilot and trigger actions based on the input. In embodiments wherein flight controller 128 includes flight controllers 128a,b, pilot input 132 may be communicatively connected to flight controllers 128a,b.

Still referring to FIG. 1, system 100 may include a primary functional display 136, which may be communicatively connected to flight controller 128 and, therefore, also communicatively connected to PMU 116 and sensor 120. In embodiments wherein CAN bus 124 includes CAN buses 124a,b, primary functional display 136 may be communicatively connected to PMU 116a via flight controller 128a and CAN bus 124a; and primary functional display 136 may be communicatively connected to PMU 116b via flight controller 128b and CAN bus 124b. Primary functional display 136 may be configured to visually display information based on battery datum from sensor 120 including battery datum, information processed by PMU 116, and/or information processed by flight controller 128. Primary functional display 136 may display, for example, the temperature of one or more of battery pack 104 and/or the state of charge of one or more of battery pack 104. Primary functional display 136 may be configured to display pilot datum inputted via pilot input 132. Primary functional display 136 may include a graphical user interface (GUI) displayed on one or more screens in electric aircraft 108. As an example, and without limitation, GUI may be displayed on any electronic device, as described herein, such as, without limitation, a computer, tablet, remote device, and/or any other visual display device. GUI may be configured to present, to pilot, information related to a flight plan. In one embodiment, the one or more screens may be multi-function displays (MFD). As an alternative to the screens or in conjunction with the screens, primary functional display 136 may include a primary display, gauges, graphs, audio cues, visual cues, information on a heads-up display (HUD) or a combination thereof. Primary functional display 136 may include a display disposed in one or more areas of an aircraft, one or more computing devices, or a combination thereof.

With continued reference to FIG. 1, battery pack 104 includes a high voltage disconnect 140 configured to connect to power supply connection 112. High voltage disconnect 140 may be configured to disconnect battery pack 104 from power supply connection 112, thereby electrically isolating battery pack 104 from electric aircraft 108 and/or electrical components on electric aircraft 108. High voltage disconnect 140 may include a relay, transistor, MOSFET, bipolar junction transistor (BJT), and/or the like. High voltage disconnect 140 may include any device suitable for use as an intertie in a ring bus. In some embodiments, battery pack 104 may include a battery storage system comprising one or more battery packs, such as a plurality of battery packs. Battery pack 104 may include a battery storage system with one, two, three, four, five or more battery packs such as battery packs 104a-n. System 100 includes a high voltage bus 144 electrically connected to high voltage disconnect 140. A "bus", for the purposes of this disclosure and in electrical parlance, is any common connection to which any number of loads, which may be connected in parallel, and share a relatively similar voltage may be electrically coupled. A bus may be responsible for conveying electrical energy stored in battery pack 104 to at least a portion of electric aircraft 108, as discussed previously in this disclosure. High voltage bus 144 may be connected to high voltage disconnect 140 via power supply connection 112. High voltage bus 144 may be electrically connected to CAN bus 124, such as CAN buses 124a,b, to provide an electrical connection from battery pack 104 to electrical components of electric aircraft 108 including, for example, primary functional display 136. High voltage bus 144 may have a first electrical connection to CAN bus 124a and a second electrical connection to CAN bus 124b. High voltage bus 144 may include a ring bus. As used in this disclosure, a "ring bus" is a looped circuit connecting loads and/or power sources in series. High voltage bus 144 may include a ring bus that connects battery packs 104a-n in series. Additional disclosure related to a ring bus can be found in U.S. patent application Ser. No. 17/348,240 filed on Jun. 15, 2021 and entitled "A SYSTEM AND METHOD FOR DYNAMIC EXCITATION OF AN ENERGY STORAGE ELEMENT CONFIGURED FOR USE IN AN ELECTRIC AIRCRAFT", the entirety of which in incorporated herein by reference. High voltage bus 144 may include circuit breakers on either side of each of battery packs 104a-n such that a circuit breaker separates each of battery packs 104a-n from another of each of battery packs 104a-n. High voltage bus 144 may include a tie element 148 to control which of battery packs 104a-n provides power to CAN bus 124a and/or CAN bus 124b. As used in this disclosure, a "tie element" may include one or more transfer switches, fuses, and/or tie breakers. Pilot input 132 may include an input for pilot to control which of battery packs 104a-n is powering electric aircraft 108 and/or components of electric aircraft 108. Flight controller 128 may be configured to receive a command selecting which of battery packs 104a-n to provide energy to electric aircraft 108 and/or components of electric aircraft 108.

Still referring to FIG. 1, system 100 may include a recharge controller 152 connected to CAN bus 124, such as CAN buses 124a,b. Recharge controller 152 may be implemented in any manner suitable for flight controller as described above; for instance, recharge controller 152 may include any computing device as described in this disclosure, including without limitation a microcontroller, microprocessor, digital signal processor (DSP) and/or system on a chip (SoC) as described in this disclosure. In some embodiments, flight controller 128 may include recharge controller 152. In some embodiments, recharger controller may include a first recharge controller 152 connected to CAN bus 124a and a second recharge controller 152 connected to CAN bus 124b. Recharge controller 152 may be configured to receive battery datum and/or information based on battery datum from PMU 116. Recharge controller 152 may be configured to control a charger. Recharge controller 152 may be configured to determine and control an operating state of charger based on battery datum. For the purposes of this disclosure, an "operating state" is a charger output and/or a charging protocol. For instance, an operating state may include a specific charging rate, a voltage level, a current level, and the like. In one or more embodiments, recharge controller 152 may be configured to adjust the operating state, such as electrical power. For example, and without limitation, operating state of a charger, such as a transmitted voltage to one or more of battery packs 104*a-n*, may be continuously adjusted as a function of continuously updating compatibility element. In one or more embodiments, during charging, recharge controller 152 may adjust the output voltage proportionally with current to compensate for impedance in the wires. Charge may be regulated using any suitable means for regulation of voltage and/or current, including without limitation use of a voltage and/or current regulating component, including one that may be electrically controlled such as a transistor; transistors may include without limitation bipolar junction transistors (BJTs), field effect transistors (FETs), metal oxide field semiconductor field effect transistors (MOSFETs), and/or any other suitable transistor or similar semiconductor element. Voltage and/or current to one or more cells may alternatively or additionally be controlled by thermistor in parallel with a cell that reduces its resistance when a temperature of the cell increases, causing voltage across the cell to drop, and/or by a current shunt or other device that dissipates electrical power, for instance through a resistor. As used in this disclosure, a "compatibility element" is an element of information regarding an operational state of an electric vehicle and/or a component of the electric vehicle, such as a battery pack. For instance, and without limitation, a compatibility element may include an operational state of a battery pack, such as a temperature state, a state of charge, a moisture-level state, a state of health (or depth of discharge), or the like. Recharge controller 152 may be consistent with disclosure of controller in U.S. patent application Ser. No. 17/477,987 filed on Sep. 17, 2021 and titled "SYSTEMS AND METHODS FOR ADAPTIVE ELECTRIC VEHICLE CHARGING", which is incorporated herein by reference in its entirety.

Figure 2:
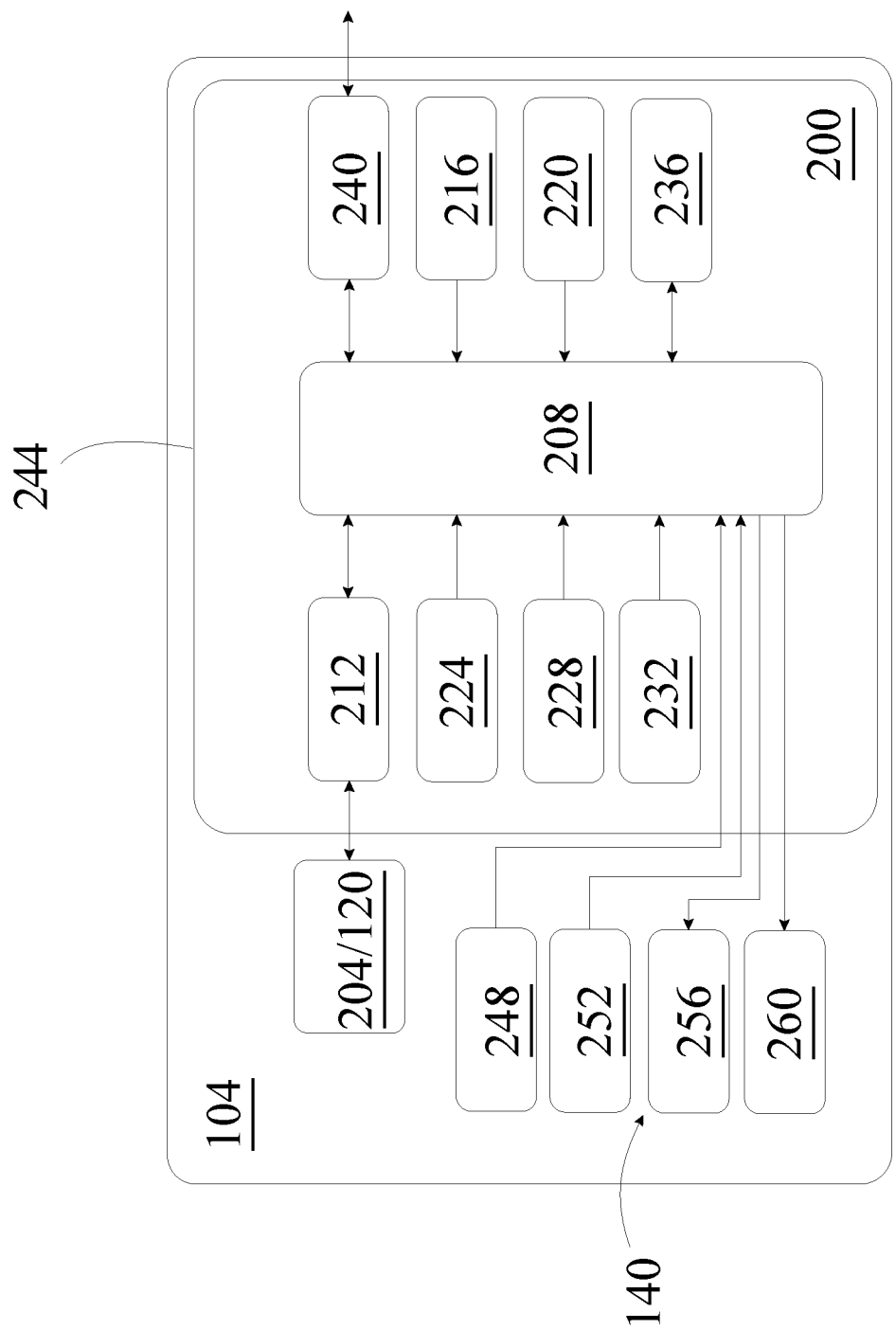
FIG. 2 is a block diagram of another exemplary embodiment a pack monitoring unit in one or more aspects of the present disclosure.

Referring now to FIG. 2, an exemplary embodiment of a PMU 200 on battery pack 104 is illustrated. PMU 200 may include sensor 120 configured to detect condition parameter and generate battery datum based on the condition parameter. In some embodiments, sensor 120 may be remote to PMU 200, for example and without limitation, a sensor of MMU 204. In one or more embodiments, condition parameter of battery pack 104 or a component of battery pack 104, such as a battery module, may be detected by sensor 120, which may be communicatively connected to MMU 204 that is incorporated in a battery module. Sensor 120 may be configured to transmit battery datum to a controller.

Still referring to FIG. 2, PMU 200 may include a controller 208. Sensor 120 may be communicatively connected to controller 208 so that sensor 120 may transmit/receive signals to/from controller 208. Signals, such as signals of sensor 120 and/or controller 208, may include electrical, electromagnetic, visual, audio, radio waves, or another undisclosed signal type alone or in combination. In one or more embodiments, communicatively connecting is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. In one or more embodiments, controller 208 may be configured to receive battery datum from sensor 120. For example, PMU 200 may receive a plurality of measurement data from MMU 204. Similarly, PMU 116*b* may receive a plurality of measurement data from MMU 204*b* (shown in FIG. 3). In one or more embodiments, PMU 200 receives battery datum from MMU 204 via a communication component 212. In one or more embodiments, communication component 144 may be a transceiver. For example, and without limitation, communication component 144 may include an isoSPI communications interface.

With continued reference to FIG. 2, controller 208 of PMU 200 may be configured to identify an operating condition of battery module 108 as a function of battery datum. For the purposes of this disclosure, an "operating condition" is a state and/or working order of a battery pack and/or any components thereof. For example, and without limitation, an operating condition may include a state of charge (SOC), a depth of discharge (DOD), a temperature reading, a moisture/humidity level, a gas level, a chemical level, or the like. In one or more embodiments, controller 208 of PMU 200 is configured to determine a critical event element if operating condition is outside of a predetermined threshold (also referred to herein as a "threshold"). For the purposes of this disclosure, a "critical event element" is a failure and/or critical operating condition of a battery pack and/or components thereof that may be harmful to the battery pack and/or corresponding electric aircraft 108. In one or more embodiments, a critical event element may include an overcurrent, undercurrent, overvoltage, overheating, high moisture levels, byproduct presence, low SOC, high DOD, or the like. For instance, and without limitation, if an identified operating condition, such as a temperature reading of 50° F., of a battery cell of battery pack 104, is outside of a predetermined threshold, such as 75° F. to 90° F., where 75° F. is the temperature threshold and 90° F. is the upper temperature threshold, then a critical event element is determined by controller 208 of PMU 200 since 50° F. is beyond the lower temperature threshold. In another example, and without limitation, PMU 200 may use battery datum from MMU 204 to identify a temperature of 95° F. for a battery module terminal. If the predetermined threshold is, for example, 90° F., then the determined operating condition exceeds the predetermined threshold, and a critical event element is determined by controller 208, such as a risk of a short at the terminal of a battery module. As used in this disclosure, a "predetermined threshold" is a limit and/or range of an acceptable quantitative value and/or combination of values such as an n-tuple or function such as linear function of values, and/or representation related to a normal operating condition of a battery pack and/or components thereof. In one or more embodiments, an operating condition outside of the threshold is a critical operating condition that indicates that a battery pack is malfunctioning, which triggers a critical event element. An operating condition within the threshold is a normal operating condition that indicates that battery pack 104 is working properly and that no action is required by PMU 200 and/or a user. For example, and without limitation, if an operating condition of temperature exceeds a predetermined threshold, as described above in this disclosure, then a battery pack is considered to be operating at a critical operating condition and may be at risk of overheating and experiencing a catastrophic failure.

Still referring to FIG. 2, controller 208 of PMU 200 may be configured to generate an action command if critical event element is determined by controller 208. For the purposes of this disclosure, an "action command" is a control signal generated by a controller that provides instructions related to reparative action needed to prevent and/or reduce damage to a battery back, components thereof, and/or aircraft as a result of a critical operating condition of the battery pack. Continuing the previously described example above, if an identified operating condition includes a temperature of 95° F., which exceeds predetermined threshold, then controller 208 may determine a critical event element indicating that battery pack 104 is working at a critical temperature level and at risk of catastrophic failure, such as short circuiting or catching fire. In one or more embodiments, critical event elements may include high shock/drop, overtemperature, undervoltage, high moisture, contactor welding, SOC unbalance, and the like. In one or more embodiments, an action command may include an instruction to terminate power supply from battery pack 104 to electric aircraft 108, power off battery pack 104, terminate a connection between one or more battery cells, initiate a temperature regulating system, such as a coolant system or opening of vents to circulate air around or through battery pack 104, or the like. In one or more embodiments, controller 208 may conduct reparative procedures via action command after determining critical even element to reduce or eliminate critical element event. For example, and without limitation, controller 208 may initiate reparative procedure of a circulation of a coolant through a cooling system of battery pack 104 to lower the temperature if a battery module if the determined temperature of the battery module exceeds a predetermined threshold. In another example, and without limitation, if a gas and/or chemical accumulation level is detected that is then determined to exceed a predetermined threshold, then high voltage disconnect 140 may terminate power supply connection 112. According to some embodiments, a vent of battery pack 104 may be opened to circulate air through battery pack 104 and reduce detected gas levels. Additionally, vent of ground fault detection 304 may have a vacuum applied to aid in venting of ejecta. Vacuum pressure differential may range from 0.1"Hg to 36"Hg.

In one or more embodiments, a critical event alert may be generated by controller 208 of PMU 200 in addition to an action command. The critical event alert may include a lockout feature, which is an alert that remains even after rebooting of the battery pack and/or corresponding systems. Lockout feature may only be removed by a manual override or once the critical event element has ceased and is no longer determined by controller 208. In one or more embodiments, controller 208 may continuously monitor battery pack 104 and components thereof so that an operating condition is known at all times.

With continued reference to FIG. 2, controller 208 may include a computing device, which may be implemented in any manner suitable for implementation of a computing device as described in this disclosure, a microcontroller, a logic device, a central processing unit (CPU), a microprocessor, a digital signal processor (DSP), an application specific integrated circuit (ASIC), a control circuit, a combination thereof, or the like. In one or more embodiments, output signals from various components of battery pack 104 may be analog or digital. Controller 208 may convert output signals from MMU 204, sensor 120, and/or sensors 216, 220,224,228,232 to a usable form by the destination of those signals. The usable form of output signals from MMUs and/or sensors, through processor may be either digital, analog, a combination thereof, or an otherwise unstated form. Processing may be configured to trim, offset, or otherwise compensate the outputs of sensor 120. Based on MMU and/or sensor output, controller can determine the output to send to a downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components. In one or more embodiments, PMU 200 may run state estimation algorithms. In one or more embodiments, PMU 200 may communicate with MMU 204 and/or sensor 120 via a communication component 144. For example, and without limitation, PMU 200 may communicate with MMU 204 using an isoSPI transceiver.

In one or more embodiments, controller 208 may be designed and/or configured to perform any method, method step, or sequence of method steps in any embodiment described in this disclosure, in any order and with any degree of repetition. For instance, controller 208 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. controller 208 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Still referring to FIG. 2, PMU 200 may include a memory component 236 configured to store data related to battery pack 104 and/or components thereof. In one or more embodiments, memory component 236 may store battery pack data. Battery pack data may include generated data, detected data, measured data, inputted data, determined data and the like. For example, battery datum from MMU 112 and or a sensor may be stored in memory component 236. In another example, critical event element and/or corresponding lockout flag may be stored in memory component 236. Battery pack data may also include inputted datum, which may include total flight hours that battery pack 104 and/or electric aircraft 108 have been operating, flight plan of electric aircraft 108, battery pack identification, battery pack verification, a battery pack maintenance history, battery pack specifications, or the like. In one or more embodiments, battery pack maintenance history may include mechanical failures and technician resolutions thereof, electrical failures and technician resolutions thereof. In one or more embodiments, memory component 236 may be communicatively connected to sensors, such as sensor 120, that detect, measure, and obtain a plurality of measurements, which may include current, voltage, resistance, impedance, coulombs, watts, temperature, moisture/humidity, or a combination thereof. Additionally or alternatively, memory component 236 may be communicatively connected to a sensor suite consistent with this disclosure to measure physical and/or electrical characteristics. In one or more embodiments, memory component 236 may store the battery pack data that includes a predetermined threshold consistent with this disclosure. The moisture-level threshold may include an absolute, relative, and/or specific moisture-level threshold. Battery pack 104 may be designed to the Federal Aviation Administration (FAA)'s Design Assurance Level A (DAL-A), using redundant DAL-B subsystems.

With continued reference to FIG. 2, in one or more embodiments, memory component 236 may be configured to save battery datum, operating condition, critical event element, and the like periodically in regular intervals to memory component 236. "Regular intervals", for the purposes of this disclosure, refers to an event taking place repeatedly after a certain amount of elapsed time. In one or more embodiments, PMU 200 may include a timer that works in conjunction to determine regular intervals. In other embodiments, PMU 200 may continuously update operating condition or critical event element and, thus, continuously store data related the information in memory component. A timer may include a timing circuit, internal clock, or other circuit, component, or part configured to keep track of elapsed time and/or time of day. For example, in non-limiting embodiments, data storage system 120 may save the first and second battery pack data every 30 seconds, every minute, every 30 minutes, or another time period according to timer. Additionally or alternatively, memory component 236 may save battery pack data after certain events occur, for example, in non-limiting embodiments, each power cycle, landing of electric aircraft 108, when battery pack 104 is charging or discharging, a failure of battery module, a malfunction of battery module, a critical event element, or scheduled maintenance periods. In nonlimiting embodiments, battery pack 104 phenomena may be continuously measured and stored at an intermediary storage location, and then permanently saved by memory component 236 at a later time, like at a regular interval or after an event has taken place as disclosed hereinabove. Additionally or alternatively, data storage system may be configured to save battery pack data at a predetermined time. "Predetermined time", for the purposes of this disclosure, refers to an internal clock within battery pack 104 commanding memory component 236 to save battery pack data at that time.

Memory component 236 may include a solid-state memory or tape hard drive. Memory component 236 may be communicatively connected to PMU 200 and may be configured to receive electrical signals related to physical or electrical phenomenon measured and store those electrical signals as battery module data. Alternatively, memory component 236 may be a plurality of discrete memory components that are physically and electrically isolated from each other. One of ordinary skill in the art would understand the virtually limitless arrangements of data stores with which battery pack 104 could employ to store battery pack data.

Still referring to FIG. 2, PMU 200 may be configured to communicate with electric aircraft 108, such as flight controller 128 of electric aircraft 108 illustrated in FIG. 1, using a controller area network (CAN), such as by using a CAN transceiver 240. In one or more embodiments, controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 104 to any destination on or offboard electric aircraft 108. PMU 200 may include wiring or conductive surfaces only in portions required to electrically couple bus to electrical power or necessary circuits to convey that power or signals to their destinations. In one or more embodiments, PMU 200 may transmit action command via CAN transceiver 240 and/or an alert to electric aircraft 108. For example, and without limitation, PMU 200 may transmit an alert to a user interface, such as a display, of electric aircraft 108 to indicate to a user that a critical event element has been determined. In one or more embodiments, PMU 200 may also use CAN transceiver 240 to transmit an alert to a remote user device, such as a laptop, mobile device, tablet, or the like.

In one or more embodiments, PMU 200 may include a housing 244. In one or more embodiments, housing 244 may include materials which possess characteristics suitable for thermal insulation, such as fiberglass, iron fibers, polystyrene foam, and thin plastic films, to name a few. Housing 244 may also include polyvinyl chloride (PVC), glass, asbestos, rigid laminate, varnish, resin, paper, Teflon, rubber, and mechanical lamina to physically isolate components of battery pack 104 from external components. In one or more embodiments, housing 244 may also include layers that separate individual components of PMU 200, such as components described above in this disclosure. As understood by one skilled in the art, housing 244 may be any shape or size suitable to attached to a battery module, such as battery module of battery pack 104. In one or more embodiments, controller 208, memory component 236, sensor 120, or the like may be at least partially disposed within housing 244.

With continued reference to FIG. 2, PMU 200 may be in communication with high voltage disconnect 140 of battery pack 104. In one or more embodiments, high voltage disconnect 140 may include a bus. High voltage disconnect 140 may include a ground fault detection 248, an HV (high voltage) current sensor 252, an HV pyro fuse 256, an HV contactor 260, and the like. High voltage disconnect 140 may physically and/or electrically breaks power supply communication between electric aircraft 108 and battery module of battery pack 104. In one or more embodiments, in one or more embodiments, the termination of power supply connection 112, shown in FIG. 1, between high voltage disconnect 140 and electric aircraft 108 may be restored by high voltage disconnect 140 once PMU 200 no longer determined a critical event element. In other embodiments, power supply connection 112 may need to be restored manually, such as by a user. In one or more embodiments, PMU 200 may also include a switching regulator, which is configured to receive power from a battery module of battery pack 104. Thus, PMU 200 may be powered by energy by battery pack 104.

Figure 3:
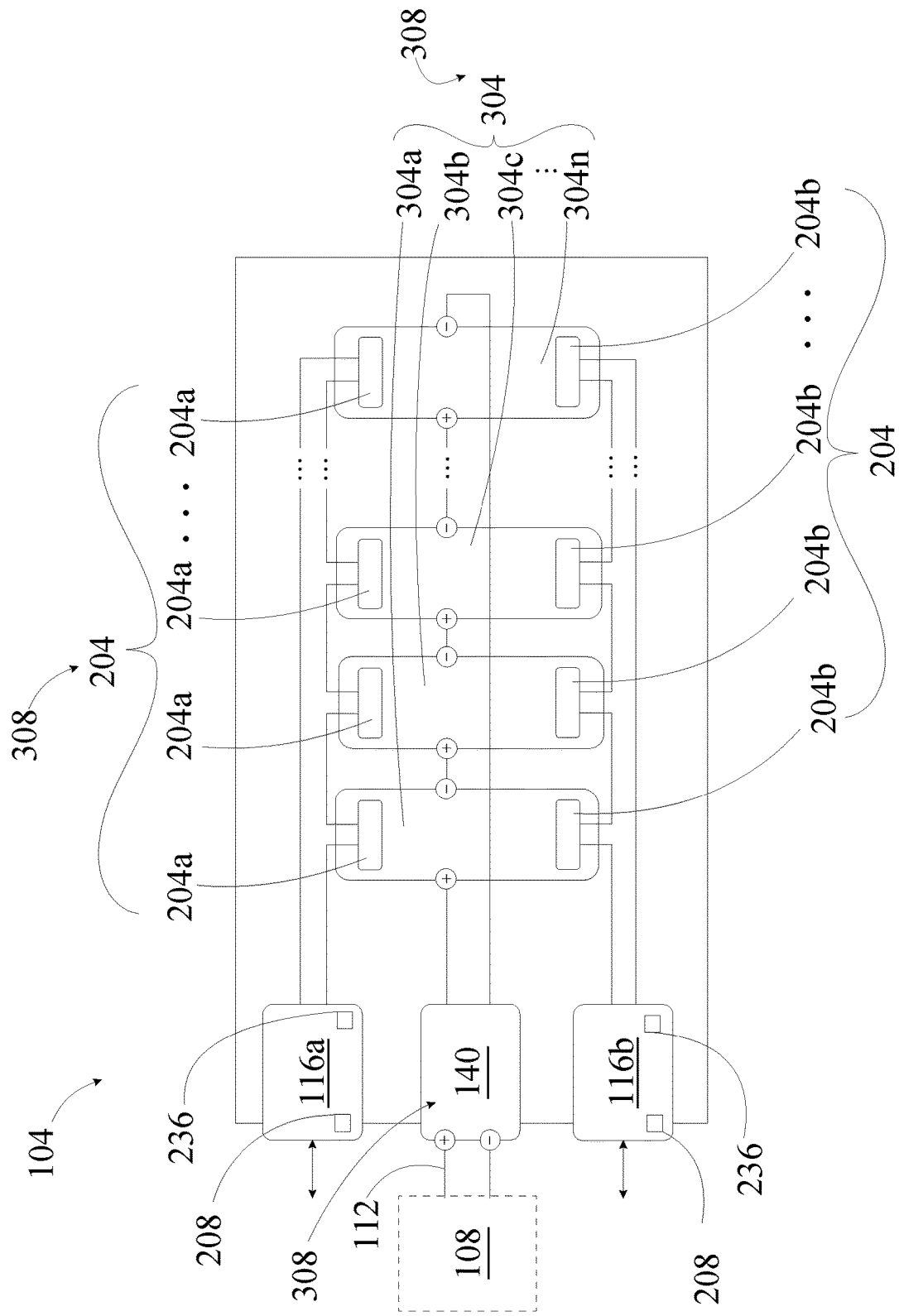
FIG. 3 is a block diagram of an exemplary embodiment of a battery pack in one or more aspects of the present disclosure.

Referring now to FIG. 3, an exemplary embodiment of a battery pack 104 is presented in accordance with one or more embodiments of the present disclosure. In one or more embodiments, battery pack 104 may include a battery module 304, which is configured to provide energy to electric aircraft 108 via power supply connection 112. In one or more embodiments, battery pack 104 may include a plurality of battery modules, also referred to as sub-packs, such as battery modules 304a-n. For example, and without limitation, battery pack 104 may include fourteen battery modules. In one or more embodiments, each battery module 304a-n may include a battery cell. For example, and without limitation, battery module 304 may include a plurality of battery cells.

Still referring to FIG. 3, battery pack 104 may include a battery management component 308 (also referred to herein as a "management component"). In one or more embodiments, battery management component 308 may be integrated into battery pack 104 in a portion of battery pack 104 or a component thereof. In an exemplary embodiment, and without limitation, battery management component 308 may be disposed on a first end of battery pack 104. One of ordinary skill in the art will appreciate that there are various areas in and on a battery pack and/or subassemblies thereof that may include battery management component 308. In one or more embodiments, battery management component 308 may be disposed directly over, adjacent to, facing, and/or near a battery module and specifically at least a portion of a battery cell. In one or more embodiments, battery management component 308 may include PMU 116, MMU 204, and high voltage disconnect 140. In one or more embodiments, battery management component 308 may also include sensor 120. For example, and without limitation, battery management component 308 may include a sensor suite, as discussed below.

With continued reference to FIG. 3, battery management component 308 may include MMU 204, which may be mechanically connected and communicatively connected to battery module 304. In one or more embodiments, MMU 204 may be configured to detect condition parameter of battery module 304. Condition parameter may include detectable information related to, for example, a temperature, a moisture level, a humidity, a voltage, a current, vent gas, vibrations, chemical content, or other measurable characteristics of battery pack 104, battery module 304, and/or a battery cell. For example, and without limitation, MMU 204 may detect and/or measure a condition parameter, such as a temperature, of battery module 304. In one or more embodiments, a condition parameter of battery pack 104 may include a condition parameter of battery module 304 and/or a battery cell. In one or more embodiments, MMU 204 may include sensor 120.

Still referring to FIG. 3, MMU 204 may be configured to transmit a battery datum of battery module 304. MMU 204 may generate an output signal such as battery datum that includes information regarding detected condition parameter. In one or more embodiments, battery datum may be transmitted by MMU 204 to PMU 116 so that PMU 116 may receive battery datum, as discussed further in this disclosure. For example, MMU 204 may transmit battery data to controller 208 of PMU 116.

In one or more embodiments, MMU 204 may include a plurality of MMUs. For instance, and without limitation, each battery module 304a-n may include one or more MMUs 204. For example, and without limitation, each battery module 304a-n may include two MMUs 204a,b. MMUs 204a,b may be positioned on opposing sides of battery module 304. Battery module 304 may include a plurality of MMUs to create redundancy so that, if one MMU fails or malfunctions, another MMU may still operate properly. In one or more nonlimiting exemplary embodiments, MMU 204 may include mature technology so that there is a low risk. Furthermore, MMU 204 may not include software, for example, to avoid complications often associated with programming. MMU 204 may be configured to monitor and balance all battery cell groups of battery pack 104 during charging of battery pack 104. For instance, and without limitation, MMU 204 may monitor a temperature of battery module 304 and/or a battery cell of battery module 304. For example, and without limitation, MMU 204 may monitor a battery cell group temperature. In another example, and without limitation, MMU 204 may monitor a terminal temperature to, for example, detect a poor HV electrical connection. In one or more embodiments, an MMU 204 may be indirectly connected to PMU 116. In other embodiments, MMU 204 may be directly connected to PMU 116. In one or more embodiments, MMU 204 may be communicatively connected to an adjacent MMU 204.

Still referring to FIG. 3, battery management component 308 may include PMU 116, which is communicatively connected to MMU 204. As previously discussed in this disclosure, PMU 116 includes a controller 208, which is configured to receive battery datum from MMU 204. For example, PMU 116a may receive a plurality of measurement data from MMU 204a. Similarly, PMU 116b may receive a plurality of measurement data from MMU 204b. In one or more embodiments, PMU 116 may receive battery datum from MMU 204 via communicative connections. For example, PMU 116 may receive battery datum from MMU 204 via an isoSPI communications interface.

In one or more embodiments, battery management component 308 may include a plurality of PMUs 116. For instance, and without limitation, battery management component 308 may include a pair of PMUs. For example, and without limitation, battery management component 308 may include a first PMU 116a and a second PMU 116b, which are each disposed in or on battery pack 104 and may be physically isolated from each other. "Physical isolation", for the purposes of this disclosure, refer to a first system's components, communicative connection, and any other constituent parts, whether software or hardware, are separated from a second system's components, communicative coupling, and any other constituent parts, whether software or hardware, respectively. Continuing in reference to the non-limiting exemplary embodiment, first PMU 116a and second PMU 116b may perform the same or different functions. For example, and without limitation, the first and second PMUs 116a,b may perform the same, and therefore, redundant functions. Thus, if one PMU 116a/b fails or malfunctions, in whole or in part, the other PMU 116b/a may still be operating properly and therefore battery management component 308 may still operate and function properly for battery pack 104. One of ordinary skill in the art would understand that the terms "first" and "second" do not refer to either PMU as primary or secondary. In non-limiting embodiments, the first and second PMUs 116a,b, due to their physical isolation, may be configured to withstand malfunctions or failures in the other system and survive and operate. Provisions may be made to shield first PMU 116a from PMU 116b other than physical location, such as structures and circuit fuses. In non-limiting embodiments, first PMU 116a, second PMU 116b, or subcomponents thereof may be disposed on an internal component or set of components within battery pack 104, such as on battery module sense board, as discussed further below in this disclosure.

Still referring to FIG. 3, first PMU 116a may be electrically isolated from second PMU 116b. "Electrical isolation", for the purposes of this disclosure, refer to a first system's separation of components carrying electrical signals or electrical energy from a second system's components. First PMU 116a may suffer an electrical catastrophe, rendering it inoperable, and due to electrical isolation, second PMU 116b may still continue to operate and function normally, allowing for continued management of battery pack 104 of electric aircraft 108. Shielding such as structural components, material selection, a combination thereof, or another undisclosed method of electrical isolation and insulation may be used, in nonlimiting embodiments. For example, and without limitation, a rubber or other electrically insulating material component may be disposed between electrical components of first and second PMUs 116*a,b*, preventing electrical energy to be conducted through it, isolating the first and second PMUs 116*a,b* form each other.

Still referring to FIG. 3, high voltage disconnect 140 is communicatively connected to battery module 108, wherein high voltage disconnect 140 is configured to terminate power supply connection 112 between battery module 304 and electric aircraft 108 in response to receiving action command from PMU 116. PMU 116 may be configured to determine a critical event element, such as high shock/drop, overtemperature, undervoltage, contactor welding, and the like. High voltage disconnect 132 is configured to receive action command generated by PMU 116 and lock out battery pack 104 for maintenance in response to received action command. In one or more embodiments, PMU 116 may create a lockout flag, which may be stored persistently in in memory component 236. For instance, and without limitation, lockout flag may be stored in a storage component and/or device that retains information after being powered down. For example, and without limitation, memory component 236 may be a flash, hard disk memory, secondary memory, or the like. A lockout flag may include an indicator alerting a user of termination of power supply connection 112 by high voltage disconnect 140. For instance, and without limitation, a lockout flag may be saved in a database of memory component 236 of PMU 116 so that, despite rebooting battery pack 104 or complete loss of power of battery pack 104, power supply connection remains terminated and an alert regarding the termination remains. In one or more embodiments, lockout flag cannot be removed until a critical event element is no longer determined by controller 212. For, example, PMU 116 may be continuously updating an operating condition and determining if operating condition is outside of a predetermined threshold. In one or more embodiments, lockout flag may include an alert on a graphic user interface of, for example, a remote computing device, such as a mobile device, tablet, laptop, desktop and the like. In other embodiments, lockout flag may be indicated to a user via an illuminated LED that is remote or locally located on battery pack 104. In one or more embodiments, PMU 116 may include control of cell group balancing via MMUs, control of contactors (high voltage connections, etc.) control of welding detection, control of pyro fuses, and the like.

Figure 4:
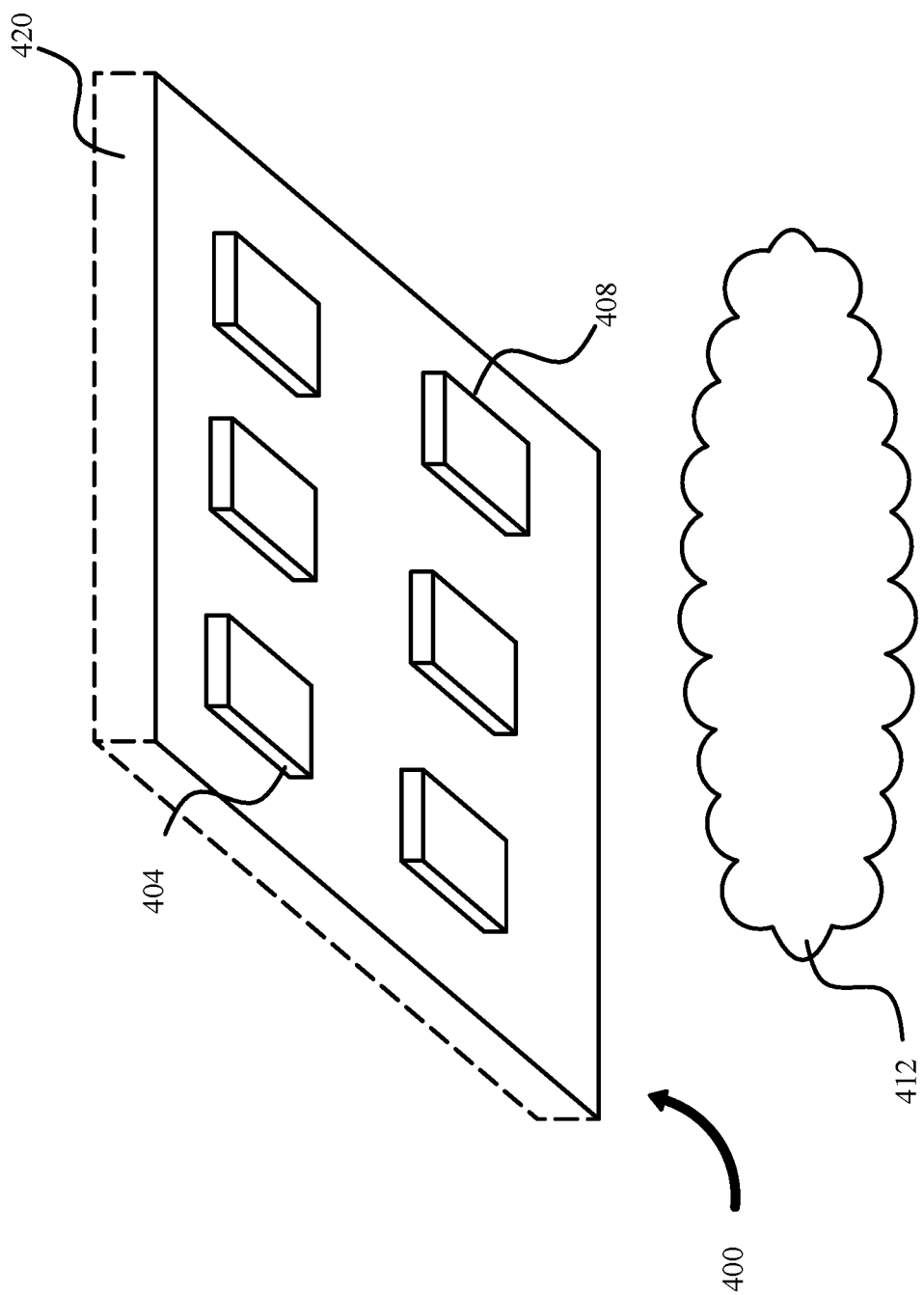
FIG. 4 is an illustration of an exemplary embodiment of a sensor suite in partial cut-off view in one or more aspects of the present disclosure.

Referring now to FIG. 4, an embodiment of sensor suite 400 is presented. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack 104 measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of battery management system 100 and/or user to detect phenomenon is maintained and in a non-limiting example, a user alter aircraft usage pursuant to sensor readings.

Sensor suite 400 may be suitable for use as sensor 120 of PMU 116 as disclosed with reference to FIG. 1 hereinabove. Sensor suite 400 includes a moisture sensor 404. "Moisture", as used in this disclosure, is the presence of water, this may include vaporized water in air, condensation on the surfaces of objects, or concentrations of liquid water. Moisture may include humidity. "Humidity", as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity", for the purposes of this disclosure, is expressed as a percentage, indicating a present stat of absolute humidity relative to a maximum humidity given the same temperature. "Specific humidity", for the purposes of this disclosure, is the ratio of water vapor mass to total moist air parcel mass, where parcel is a given portion of a gaseous medium. Moisture sensor 404 may be psychrometer. Moisture sensor 404 may be a hygrometer. Moisture sensor 404 may be configured to act as or include a humidistat. A "humidistat", for the purposes of this disclosure, is a humidity-triggered switch, often used to control another electronic device. Moisture sensor 404 may use capacitance to measure relative humidity and include in itself, or as an external component, include a device to convert relative humidity measurements to absolute humidity measurements. "Capacitance", for the purposes of this disclosure, is the ability of a system to store an electric charge, in this case the system is a parcel of air which may be near, adjacent to, or above a battery cell.

With continued reference to FIG. 4, sensor suite 400 may include electrical sensors 408. Electrical sensors 408 may be configured to measure voltage across a component, electrical current through a component, and resistance of a component. Electrical sensors 408 may include separate sensors to measure each of the previously disclosed electrical characteristics such as voltmeter, ammeter, and ohmmeter, respectively.

Alternatively or additionally, and with continued reference to FIG. 4, sensor suite 400 include a sensor or plurality thereof that may detect voltage and direct the charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor suite 400 and/or a control circuit incorporated therein and/or communicatively connected thereto may be configured to adjust charge to one or more battery cells as a function of a charge level and/or a detected parameter. For instance, and without limitation, sensor suite 400 may be configured to determine that a charge level of a battery cell is high based on a detected voltage level of that battery cell or portion of the battery pack. Sensor suite 400 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor suite 400 may include digital sensors, analog sensors, or a combination thereof. Sensor suite 400 may include digital-to-analog converters (DAC), analog-to-digital converters (ADC, A/D, A-to-D), a combination thereof, or other signal conditioning components used in transmission of a first plurality of battery pack data to a destination over wireless or wired connection.

With continued reference to FIG. 4, sensor suite 400 may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 400, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 4, sensor suite 400 may include a sensor configured to detect gas that may be emitted during or after a cell failure. "Cell failure", for the purposes of this disclosure, refers to a malfunction of a battery cell, which may be an electrochemical cell, that renders the cell inoperable for its designed function, namely providing electrical energy to at least a portion of an electric aircraft, such as electric aricraft 108 in FIG. 1. Byproducts of cell failure 412 may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 400, may be configured to detect combustible, flammable, toxic, oxygen depleted, a combination thereof, or another type of gas alone or in combination. The gas sensor that may be present in sensor suite 400 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 400 may include sensors that are configured to detect non-gaseous byproducts of cell failure 412 including, in non-limiting examples, liquid chemical leaks including aqueous alkaline solution, ionomer, molten phosphoric acid, liquid electrolytes with redox shuttle and ionomer, and salt water, among others. Sensor suite 200 may include sensors that are configured to detect non-gaseous byproducts of cell failure 412 including, in non-limiting examples, electrical anomalies as detected by any of the previous disclosed sensors or components.

With continued reference to FIG. 4, sensor suite 400 may be configured to detect events where voltage nears an upper voltage threshold or lower voltage threshold. The upper voltage threshold may be stored in memory component 236 for comparison with an instant measurement taken by any combination of sensors present within sensor suite 400. The upper voltage threshold may be calculated and calibrated based on factors relating to battery cell health, maintenance history, location within battery pack, designed application, and type, among others. Sensor suite 400 may measure voltage at an instant, over a period of time, or periodically. Sensor suite 400 may be configured to operate at any of these detection modes, switch between modes, or simultaneous measure in more than one mode. In one or more exemplary embodiments, PMU 116 may determine, using sensor suite 400, a critical event element where voltage nears the lower voltage threshold. The lower voltage threshold may indicate power loss to or from an individual battery cell or portion of the battery pack. PMU 116 may determine through sensor suite 400 critical event elements where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

In one or more embodiments, sensor suite 400 may include an inertial measurement unit (IMU). In one or more embodiments, an IMU may be configured to detect a change in specific force of a body. An IMU may include an accelerometer, a gyro sensor, a magnetometer, an E-compass, a G-sensor, a geomagnetic sensor, and the like. An IMU may be configured to obtain battery datum. PMU 116 may determine a critical event element by if, for example, an accelerometer of sensor suite 400 detects a force experienced by battery pack 104 that exceeds a predetermined threshold.

Figure 5A:
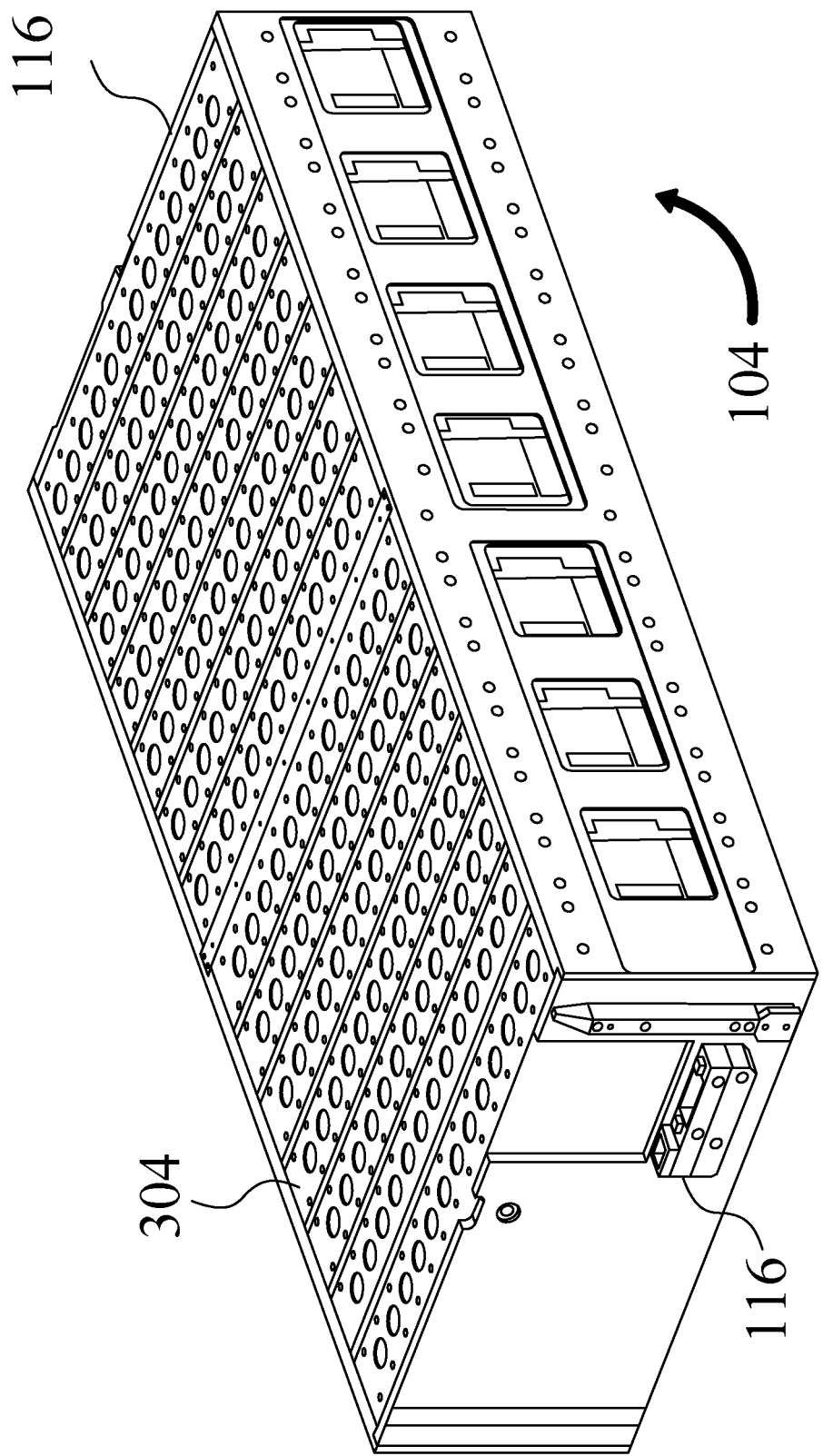
FIGS. 5A and 5B are illustrations of exemplary embodiments of a battery pack configured for use in an electric aircraft in isometric view in accordance with one or more aspects of the present disclosure.
Figure 5B:
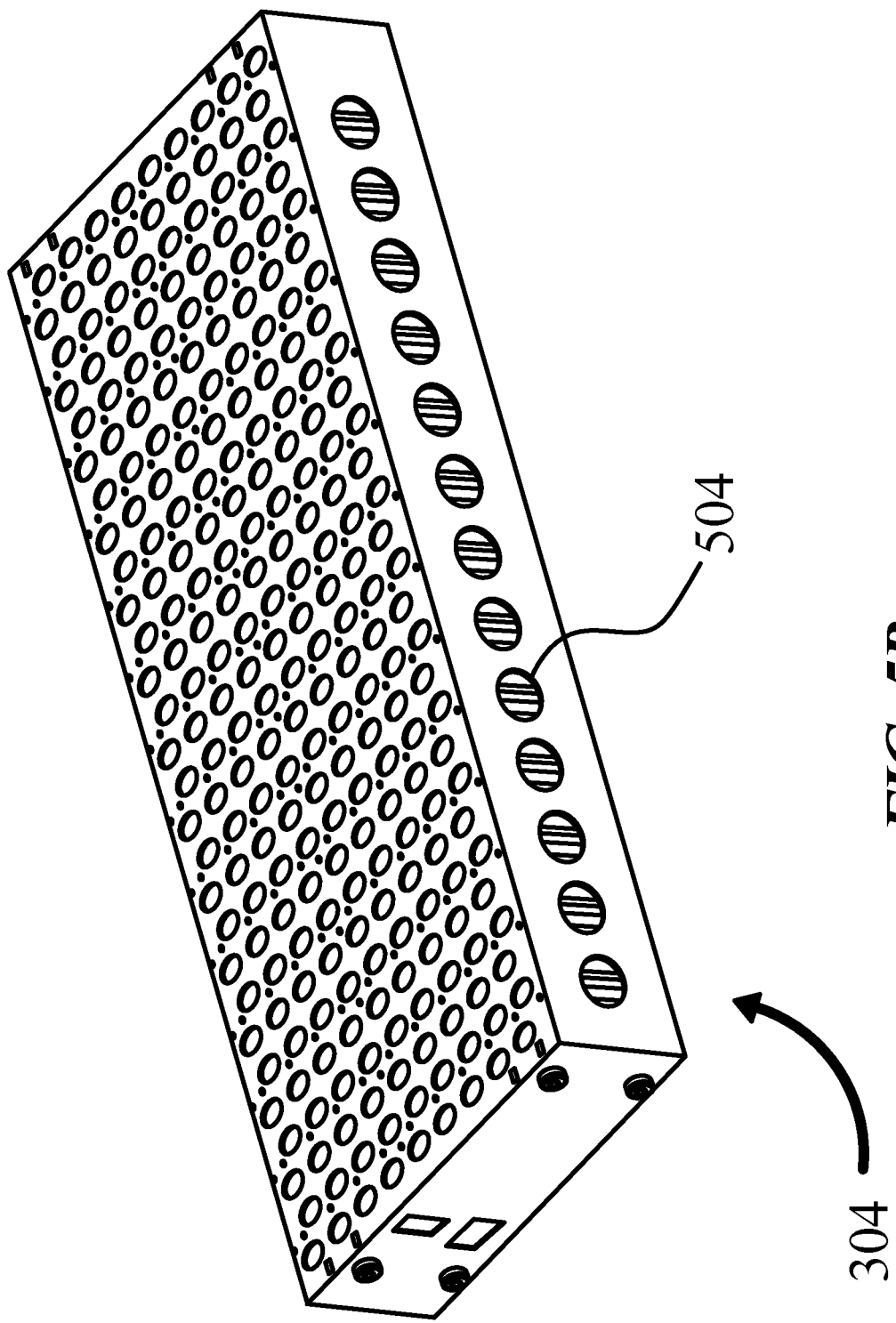

Now referring to FIGS. 5A and 5B, an exemplary embodiment of battery pack 104 is illustrated. Battery pack 104 is a power source that may be configured to store electrical energy in the form of a plurality of battery modules, which themselves include of a plurality of electrochemical cells. These cells may utilize electrochemical cells, galvanic cells, electrolytic cells, fuel cells, flow cells, and/or voltaic cells. In general, an electrochemical cell is a device capable of generating electrical energy from chemical reactions or using electrical energy to cause chemical reactions, this disclosure will focus on the former. Voltaic or galvanic cells are electrochemical cells that generate electric current from chemical reactions, while electrolytic cells generate chemical reactions via electrolysis. In general, the term 'battery' is used as a collection of cells connected in series or parallel to each other. A battery cell may, when used in conjunction with other cells, may be electrically connected in series, in parallel or a combination of series and parallel. Series connection includes wiring a first terminal of a first cell to a second terminal of a second cell and further configured to include a single conductive path for electricity to flow while maintaining the same current (measured in Amperes) through any component in the circuit. A battery cell may use the term 'wired', but one of ordinary skill in the art would appreciate that this term is synonymous with 'electrically connected', and that there are many ways to couple electrical elements like battery cells together. An example of a connector that does not include wires may be prefabricated terminals of a first gender that mate with a second terminal with a second gender. Battery cells may be wired in parallel.

Parallel connection includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, battery pack 104 include 196 battery cells in series and 18 battery cells in parallel. This is, as someone of ordinary skill in the art would appreciate, is only an example and battery pack 104 may be configured to have a near limitless arrangement of battery cell configurations.

With continued reference to FIGS. 5A and 5B, battery pack 104 may include a plurality of battery modules 304. The battery modules may be wired together in series and in parallel. Battery pack 104 may include a center sheet which may include a thin barrier. The barrier may include a fuse connecting battery modules on either side of the center sheet. The fuse may be disposed in or on the center sheet and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may include a thermal fuse, mechanical fuse, blade fuse, expulsion fuse, spark gap surge arrestor, varistor, or a combination thereof.

Battery pack 104 may also include a side wall includes a laminate of a plurality of layers configured to thermally insulate the plurality of battery modules from external components of battery pack 104. The side wall layers may include materials which possess characteristics suitable for thermal insulation as described in the entirety of this disclosure like fiberglass, air, iron fibers, polystyrene foam, and thin plastic films, to name a few. The side wall may additionally or alternatively electrically insulate the plurality of battery modules from external components of battery pack 104 and the layers of which may include polyvinyl chloride (PVC), glass, asbestos, rigid laminate, varnish, resin, paper, Teflon, rubber, and mechanical lamina. The center sheet may be mechanically coupled to the side wall in any manner described in the entirety of this disclosure or otherwise undisclosed methods, alone or in combination. The side wall may include a feature for alignment and coupling to the center sheet. This feature may include a cutout, slots, holes, bosses, ridges, channels, and/or other undisclosed mechanical features, alone or in combination.

With continued reference to FIG. 5, battery pack 104 may also include an end panel including a plurality of electrical connectors and further configured to fix battery pack 104 in alignment with at least the side wall. The end panel may include a plurality of electrical connectors of a first gender configured to electrically and mechanically couple to electrical connectors of a second gender. The end panel may be configured to convey electrical energy from battery cells to at least a portion of an eVTOL aircraft. Electrical energy may be configured to power at least a portion of an eVTOL aircraft or include signals to notify aircraft computers, personnel, users, pilots, and any others of information regarding battery health, emergencies, and/or electrical characteristics. The plurality of electrical connectors may include blind mate connectors, plug and socket connectors, screw terminals, ring and spade connectors, blade connectors, and/or an undisclosed type alone or in combination. The electrical connectors of which the end panel includes may be configured for power and communication purposes. A first end of the end panel may be configured to mechanically couple to a first end of a first side wall by a snap attachment mechanism, similar to end cap and side panel configuration utilized in the battery module. To reiterate, a protrusion disposed in or on the end panel may be captured, at least in part, by a receptacle disposed in or on the side wall. A second end of end the panel may be mechanically coupled to a second end of a second side wall in a similar or the same mechanism.

With continued reference to FIGS. 5A and 5B, sensor suite 400 may be disposed in or on a portion of battery pack 104 near battery modules or battery cells. In one or more embodiments, PMU 116 may be configured to communicate with an electric aircraft, such as flight controller 128 of electric aircraft 108, using a controller area network (CAN), such as by using a CAN transceiver 240 (shown in FIG. 2). In one or more embodiments, controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 104 to any destination on or offboard an electric aircraft. Battery management component may include wiring or conductive surfaces only in portions required to electrically couple bus to electrical power or necessary circuits to convey that power or signals to their destinations.

Outputs from sensors or any other component present within system may be analog or digital. Onboard or remotely located processors can convert those output signals from sensor suite to a usable form by the destination of those signals. The usable form of output signals from sensors, through processor may be either digital, analog, a combination thereof or an otherwise unstated form. Processing may be configured to trim, offset, or otherwise compensate the outputs of sensor suite. Based on sensor output, the processor can determine the output to send to downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components.

With continued reference to FIGS. 5A and 5B, any of the disclosed components or systems, namely battery pack 104, PMU 116, and/or battery cell 504 may incorporate provisions to dissipate heat energy present due to electrical resistance in integral circuit. Battery pack 104 includes one or more battery element modules wired in series and/or parallel. The presence of a voltage difference and associated amperage inevitably will increase heat energy present in and around battery pack 104 as a whole. The presence of heat energy in a power system is potentially dangerous by introducing energy possibly sufficient to damage mechanical, electrical, and/or other systems present in at least a portion of electric aircraft 108. Battery pack 104 may include mechanical design elements, one of ordinary skill in the art, may thermodynamically dissipate heat energy away from battery pack 104. The mechanical design may include, but is not limited to, slots, fins, heat sinks, perforations, a combination thereof, or another undisclosed element.

Heat dissipation may include material selection beneficial to move heat energy in a suitable manner for operation of battery pack 104. Certain materials with specific atomic structures and therefore specific elemental or alloyed properties and characteristics may be selected in construction of battery pack 104 to transfer heat energy out of a vulnerable location or selected to withstand certain levels of heat energy output that may potentially damage an otherwise unprotected component. One of ordinary skill in the art, after reading the entirety of this disclosure would understand that material selection may include titanium, steel alloys, nickel, copper, nickel-copper alloys such as Monel, tantalum and tantalum alloys, tungsten and tungsten alloys such as Inconel, a combination thereof, or another undisclosed material or combination thereof. Heat dissipation may include a combination of mechanical design and material selection. The responsibility of heat dissipation may fall upon the material selection and design as disclosed above in regard to any component disclosed in this paper. The battery pack 104 may include similar or identical features and materials ascribed to battery pack 104 in order to manage the heat energy produced by these systems and components.

According to embodiments, the circuitry disposed within or on battery pack 104 may be shielded from electromagnetic interference. The battery elements and associated circuitry may be shielded by material such as mylar, aluminum, copper a combination thereof, or another suitable material. The battery pack 104 and associated circuitry may include one or more of the aforementioned materials in their inherent construction or additionally added after manufacture for the express purpose of shielding a vulnerable component. The battery pack 104 and associated circuitry may alternatively or additionally be shielded by location. Electrochemical interference shielding by location includes a design configured to separate a potentially vulnerable component from energy that may compromise the function of said component. The location of vulnerable component may be a physical uninterrupted distance away from an interfering energy source, or location configured to include a shielding element between energy source and target component. The shielding may include an aforementioned material in this section, a mechanical design configured to dissipate the interfering energy, and/or a combination thereof. The shielding comprising material, location and additional shielding elements may defend a vulnerable component from one or more types of energy at a single time and instance or include separate shielding for individual potentially interfering energies.

Figure 6:
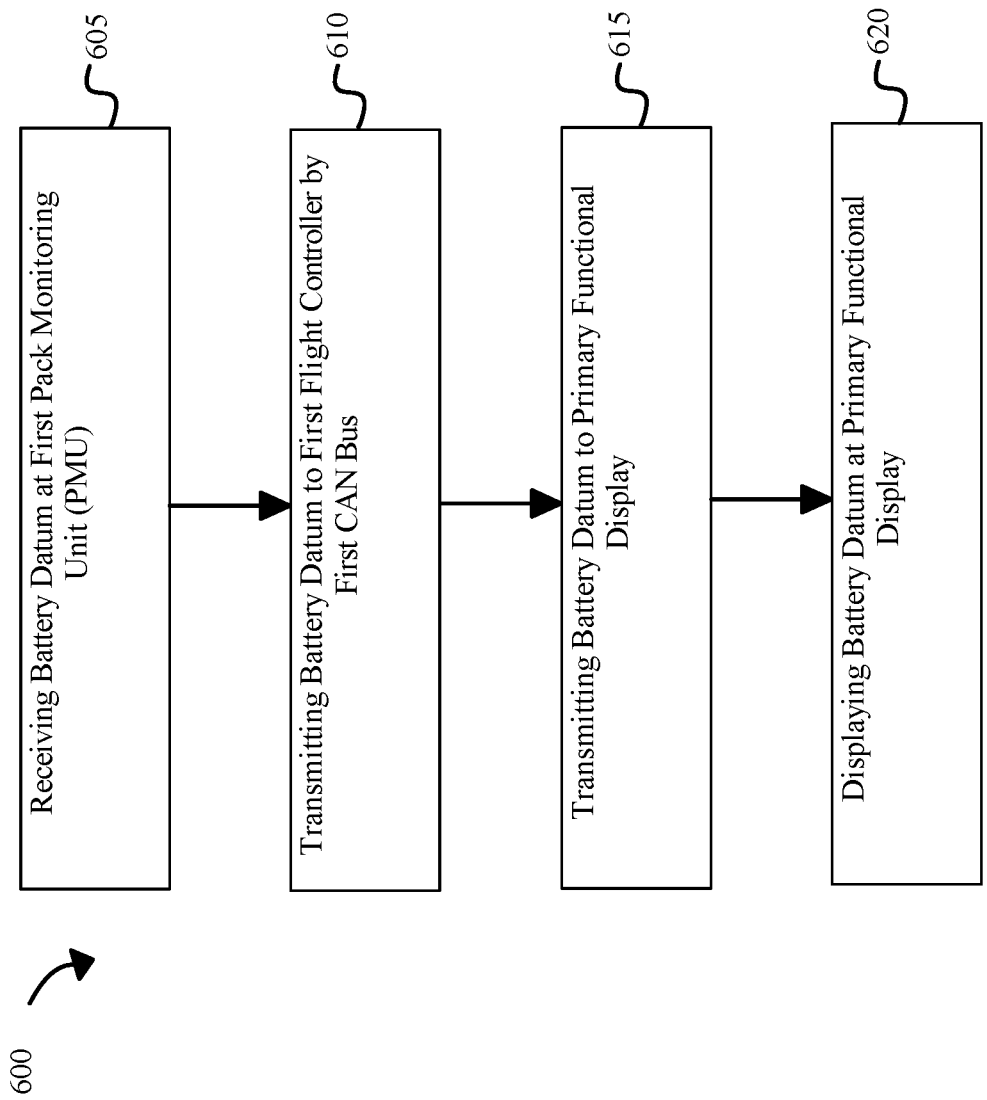
FIG. 6 is a flow chart of an exemplary embodiment of a method for battery management for electric aircraft batteries in one or more aspects of the present disclosure.

Referring now to FIG. 6, an exemplary embodiment of a method 600 for battery management for electric aircraft batteries is illustrated. At step 605, a first pack monitoring unit (PMU) receives, from a first sensor on a battery pack, a first battery datum based on a first condition parameter of the battery pack; this may be implemented, without limitation, as described above in reference to FIGS. 1-6. Method 600 may further include receiving, at a second PMU from a second sensor on battery pack, a second battery datum based on a second condition parameter of battery pack.

At step 610, and still referring to FIG. 6, the first PMU transmits first battery datum to a first flight controller; this may be implemented, without limitation, as described above in reference to FIGS. 1-6. The first PMU may process the first battery datum and transmits information based on the first battery datum to the first flight controller. The first PMU and the first flight controller may be communicatively connected by a first CAN bus. First CAN bus may be communicatively connected to a plurality of battery packs. First flight controller may be configured to control which of the plurality of battery packs provides energy to an electric aircraft. Method 600 may further include transmitting second battery datum from first PMU to a second flight controller. Second PMU and second flight controller may be communicatively connected by a second CAN bus. First CAN bus may be configured to connect to second CAN bus by a tie breaker. A high voltage bus 144 may electrically connect battery pack to first CAN bus and second CAN bus. Electric aircraft may be an electric vertical takeoff and landing (eVTOL) aircraft.

With continued reference to FIG. 6, at step 615, first flight controller transmits first battery datum to a primary functional display; this may be implemented, without limitation, as described above in reference to FIGS. 1-6. First flight controller may transmit information based on first battery datum, such as information output by first PMU and/or first flight controller based on the first battery datum.

Still referring to FIG. 6, at step 620, the primary functional display displays the first battery datum; this may be implemented, without limitation, as described above in reference to FIGS. 1-6. may display information based on the first battery datum, such as information output by first PMU and/or the first flight controller based on the first battery datum. Second battery datum may be a duplicate of first battery datum for redundancy.

Figure 7:
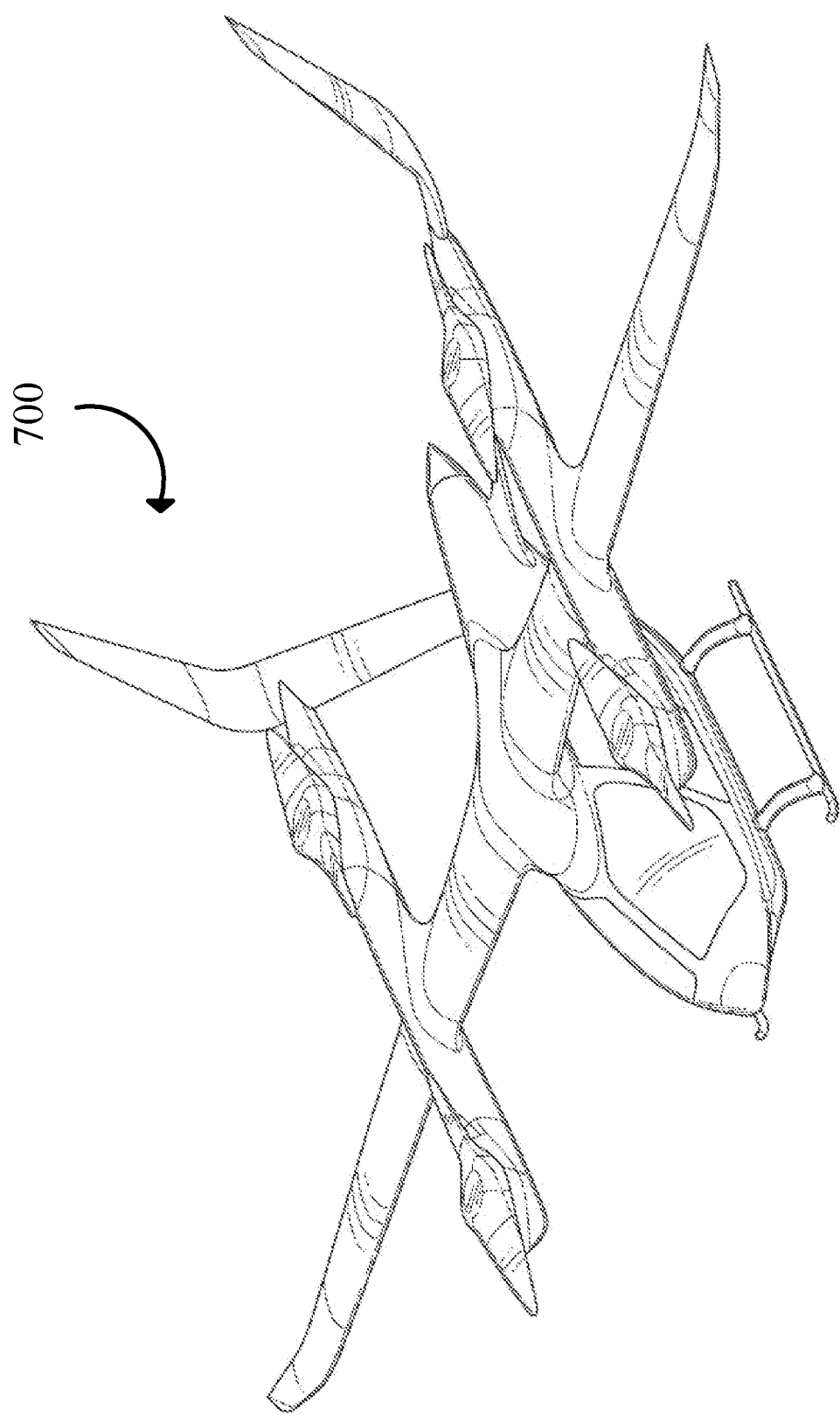
FIG. 7 is an illustration of an embodiment of an electric aircraft in one or more aspects of the present disclosure.

Referring now to FIG. 7, an embodiment of an electric aircraft 700 is presented in accordance with one or more embodiments of the present disclosure. Electric aircraft 700 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

Figure 8:
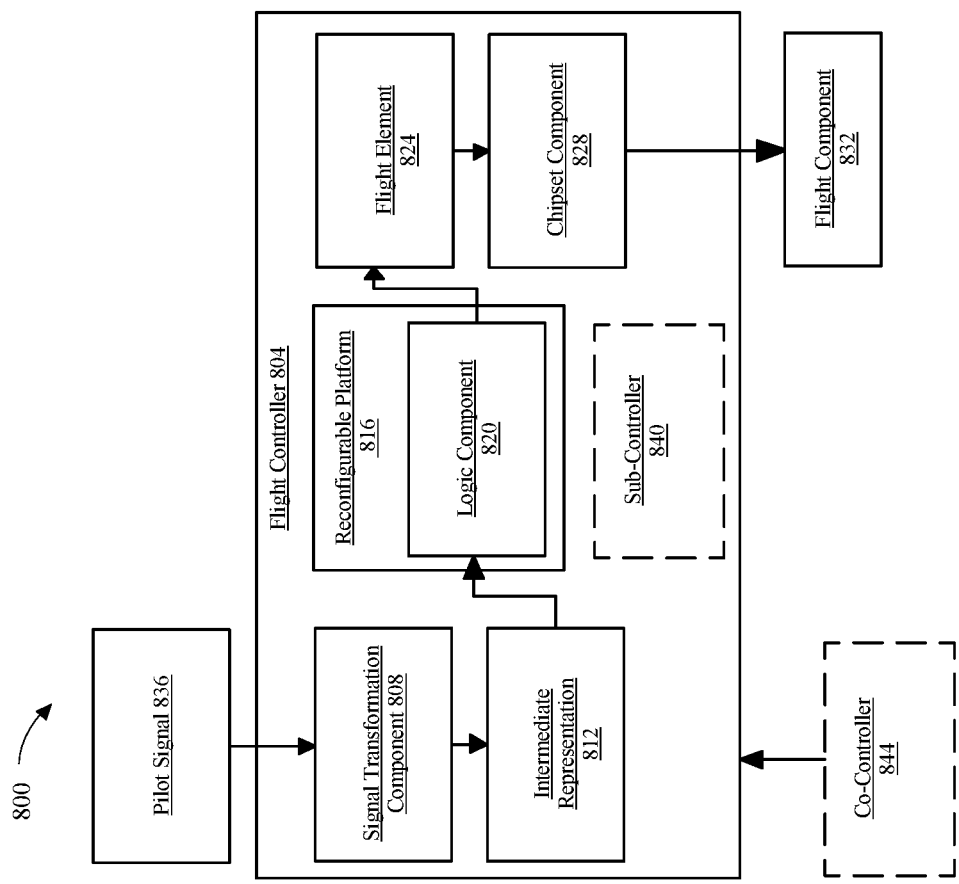
FIG. 8 is a block diagram of a flight controller according to an embodiment of the disclosure.

Now referring to FIG. 8, an exemplary embodiment 800 of flight controller 804 is illustrated. Flight controller 804 may be flight controller 128 discussed above. As used in this disclosure a "flight controller" is a computing device of a plurality of computing devices dedicated to data storage, security, distribution of traffic for load balancing, and flight instruction. Flight controller 804 may include and/or communicate with any computing device as described in this disclosure, including without limitation a microcontroller, microprocessor, digital signal processor (DSP) and/or system on a chip (SoC) as described in this disclosure. Further, flight controller 804 may include a single computing device operating independently, or may include two or more computing device operating in concert, in parallel, sequentially or the like; two or more computing devices may be included together in a single computing device or in two or more computing devices. In embodiments, flight controller 804 may be installed in an aircraft, may control the aircraft remotely, and/or may include an element installed in the aircraft and a remote element in communication therewith.

In an embodiment, and still referring to FIG. 8, flight controller 804 may include a signal transformation component 808. As used in this disclosure a "signal transformation component" is a component that transforms and/or converts a first signal to a second signal, wherein a signal may include one or more digital and/or analog signals. For example, and without limitation, signal transformation component 808 may be configured to perform one or more operations such as preprocessing, lexical analysis, parsing, semantic analysis, and the like thereof. In an embodiment, and without limitation, signal transformation component 808 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 808 may include transforming one or more low-level languages such as, but not limited to, machine languages and/or assembly languages. For example, and without limitation, signal transformation component 808 may include transforming a binary language signal to an assembly language signal. In an embodiment, and without limitation, signal transformation component 808 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 8, signal transformation component 808 may be configured to optimize an intermediate representation 812. As used in this disclosure an "intermediate representation" is a data structure and/or code that represents the input signal. Signal transformation component 808 may optimize intermediate representation as a function of a data-flow analysis, dependence analysis, alias analysis, pointer analysis, escape analysis, and the like thereof. In an embodiment, and without limitation, signal transformation component 808 may optimize intermediate representation 812 as a function of one or more inline expansions, dead code eliminations, constant propagation, loop transformations, and/or automatic parallelization functions. In another embodiment, signal transformation component 808 may optimize intermediate representation as a function of a machine dependent optimization such as a peephole optimization, wherein a peephole optimization may rewrite short sequences of code into more efficient sequences of code. Signal transformation component 808 may optimize intermediate representation to generate an output language, wherein an "output language," as used herein, is the native machine language of flight controller 804. For example, and without limitation, native machine language may include one or more binary and/or numerical languages.

In an embodiment, and without limitation, signal transformation component 808 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 8, flight controller 804 may include a reconfigurable hardware platform 816. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 816 may be reconfigured to enact any algorithm and/or algorithm selection process received from another computing device and/or created using machine-learning processes.

Still referring to FIG. 8, reconfigurable hardware platform 816 may include a logic component 820. As used in this disclosure a "logic component" is a component that executes instructions on output language. For example, and without limitation, logic component may perform basic arithmetic, logic, controlling, input/output operations, and the like thereof. Logic component 820 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 820 may be organized according to Von Neumann and/or Harvard architecture as a non-limiting example. Logic component 820 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC). In an embodiment, logic component 820 may include one or more integrated circuit microprocessors, which may contain one or more central processing units, central processors, and/or main processors, on a single metal-oxide-semiconductor chip. Logic component 820 may be configured to execute a sequence of stored instructions to be performed on the output language and/or intermediate representation 812. Logic component 820 may be configured to fetch and/or retrieve the instruction from a memory cache, wherein a "memory cache," as used in this disclosure, is a stored instruction set on flight controller 804. Logic component 820 may be configured to decode the instruction retrieved from the memory cache to opcodes and/or operands. Logic component 820 may be configured to execute the instruction on intermediate representation 812 and/or output language. For example, and without limitation, logic component 820 may be configured to execute an addition operation on intermediate representation 812 and/or output language.

In an embodiment, and without limitation, logic component 820 may be configured to calculate a flight element 824. As used in this disclosure a "flight element" is an element of datum denoting a relative status of aircraft. For example, and without limitation, flight element 824 may denote one or more torques, thrusts, airspeed velocities, forces, altitudes, groundspeed velocities, directions during flight, directions facing, forces, orientations, and the like thereof. For example, and without limitation, flight element 824 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 824 may denote that aircraft is following a flight path accurately and/or sufficiently.

Still referring to FIG. 8, flight controller 804 may include a chipset component 828. As used in this disclosure a "chipset component" is a component that manages data flow. In an embodiment, and without limitation, chipset component 828 may include a northbridge data flow path, wherein the northbridge dataflow path may manage data flow from logic component 820 to a high-speed device and/or component, such as a RAM, graphics controller, and the like thereof. In another embodiment, and without limitation, chipset component 828 may include a southbridge data flow path, wherein the southbridge dataflow path may manage data flow from logic component 820 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 828 may manage data flow between logic component 820, memory cache, and a flight component 832. As used in this disclosure a "flight component" is a portion of an aircraft that can be moved or adjusted to affect one or more flight elements. For example, flight component 832 may include a component used to affect the aircrafts' roll and pitch which may comprise one or more ailerons. As a further example, flight component 832 may include a rudder to control yaw of an aircraft. In an embodiment, chipset component 828 may be configured to communicate with a plurality of flight components as a function of flight element 824. For example, and without limitation, chipset component 828 may transmit to an aircraft rotor to reduce torque of a first lift propulsor and increase the forward thrust produced by a pusher component to perform a flight maneuver.

In an embodiment, and still referring to FIG. 8, flight controller 804 may be configured generate an autonomous function. As used in this disclosure an "autonomous function" is a mode and/or function of flight controller 804 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 824. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 804 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 804 will control the ailerons and/or rudders. As used in this disclosure "non-autonomous mode" is a mode that denotes a pilot will control aircraft and/or maneuvers of aircraft in its entirety.

In an embodiment, and still referring to FIG. 8, flight controller 804 may generate autonomous function as a function of an autonomous machine-learning model. As used in this disclosure an "autonomous machine-learning model" is a machine-learning model to produce an autonomous function output given flight element 824 and a pilot signal 836 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 836 may denote that a pilot is controlling and/or maneuvering ailerons, wherein the pilot is not in control of the rudders and/or propulsors. In an embodiment, pilot signal 836 may include an implicit signal and/or an explicit signal. For example, and without limitation, pilot signal 836 may include an explicit signal, wherein the pilot explicitly states there is a lack of control and/or desire for autonomous function. As a further non-limiting example, pilot signal 836 may include an explicit signal directing flight controller 804 to control and/or maintain a portion of aircraft, a portion of the flight plan, the entire aircraft, and/or the entire flight plan. As a further non-limiting example, pilot signal 836 may include an implicit signal, wherein flight controller 804 detects a lack of control such as by a malfunction, torque alteration, flight path deviation, and the like thereof. In an embodiment, and without limitation, pilot signal 836 may include one or more explicit signals to reduce torque, and/or one or more implicit signals that torque may be reduced due to reduction of airspeed velocity. In an embodiment, and without limitation, pilot signal 836 may include one or more local and/or global signals. For example, and without limitation, pilot signal 836 may include a local signal that is transmitted by a pilot and/or crew member. As a further non-limiting example, pilot signal 836 may include a global signal that is transmitted by air traffic control and/or one or more remote users that are in communication with the pilot of aircraft. In an embodiment, pilot signal 836 may be received as a function of a tri-state bus and/or multiplexor that denotes an explicit pilot signal should be transmitted prior to any implicit or global pilot signal.

Still referring to FIG. 8, autonomous machine-learning model may include one or more autonomous machine-learning processes such as supervised, unsupervised, or reinforcement machine-learning processes that flight controller 804 and/or a remote device may or may not use in the generation of autonomous function. As used in this disclosure "remote device" is an external device to flight controller

804. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 8, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 804 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 8, flight controller 804 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 804. Remote device and/or FPGA may transmit a signal, bit, datum, or parameter to flight controller 804 that at least relates to autonomous function. Additionally or alternatively, the remote device and/or FPGA may provide an updated machine-learning model. For example, and without limitation, an updated machine-learning model may be comprised of a firmware update, a software update, an autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 804 as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 8, flight controller 804 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 8, flight controller 804 may include, but is not limited to, for example, a cluster of flight controllers in a first location and a second flight controller or cluster of flight controllers in a second location. Flight controller 804 may include one or more flight controllers dedicated to data storage, security, distribution of traffic for load balancing, and the like. Flight controller 804 may be configured to distribute one or more computing tasks as described below across a plurality of flight controllers, which may operate in parallel, in series, redundantly, or in any other manner used for distribution of tasks or memory between computing devices. For example, and without limitation, flight controller 804 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Mass., USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 8, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 832. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 8, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 804. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 812 and/or output language from logic component 820, wherein output language may include one or more analog-to-digital conversions, low bit rate transmissions, message encryptions, digital signals, binary signals, logic signals, analog signals, and the like thereof described above in detail.

Still referring to FIG. 8, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 8, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 8, flight controller 804 may also be implemented using a "shared nothing" architecture in which data is cached at the worker, in an embodiment, this may enable scalability of aircraft and/or computing device. Flight controller 804 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 8, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function $\varphi$, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 8, flight controller may include a sub-controller 840. As used in this disclosure a "sub-controller" is a controller and/or component that is part of a distributed controller as described above; for instance, flight controller 804 may be and/or include a distributed flight controller made up of one or more sub-controllers. For example, and without limitation, sub-controller 840 may include any controllers and/or components thereof that are similar to distributed flight controller and/or flight controller as described above. Sub-controller 840 may include any component of any flight controller as described above. Sub-controller 840 may be implemented in any manner suitable for implementation of a flight controller as described above. As a further non-limiting example, sub-controller 840 may include one or more processors, logic components and/or computing devices capable of receiving, processing, and/or transmitting data across the distributed flight controller as described above. As a further non-limiting example, sub-controller 840 may include a controller that receives a signal from a first flight controller and/or first distributed flight controller component and transmits the signal to a plurality of additional sub-controllers and/or flight components.

Still referring to FIG. 8, flight controller may include a co-controller 844. As used in this disclosure a "co-controller" is a controller and/or component that joins flight controller 804 as components and/or nodes of a distributer flight controller as described above. For example, and without limitation, co-controller 844 may include one or more controllers and/or components that are similar to flight controller 804. As a further non-limiting example, co-controller 844 may include any controller and/or component that joins flight controller 804 to distributer flight controller. As a further non-limiting example, co-controller 844 may include one or more processors, logic components and/or computing devices capable of receiving, processing, and/or transmitting data to and/or from flight controller 804 to distributed flight control system. Co-controller 844 may include any component of any flight controller as described above. Co-controller 844 may be implemented in any manner suitable for implementation of a flight controller as described above.

In an embodiment, and with continued reference to FIG. 8, flight controller 804 may be designed and/or configured to perform any method, method step, or sequence of method steps in any embodiment described in this disclosure, in any order and with any degree of repetition. For instance, flight controller 804 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 9:
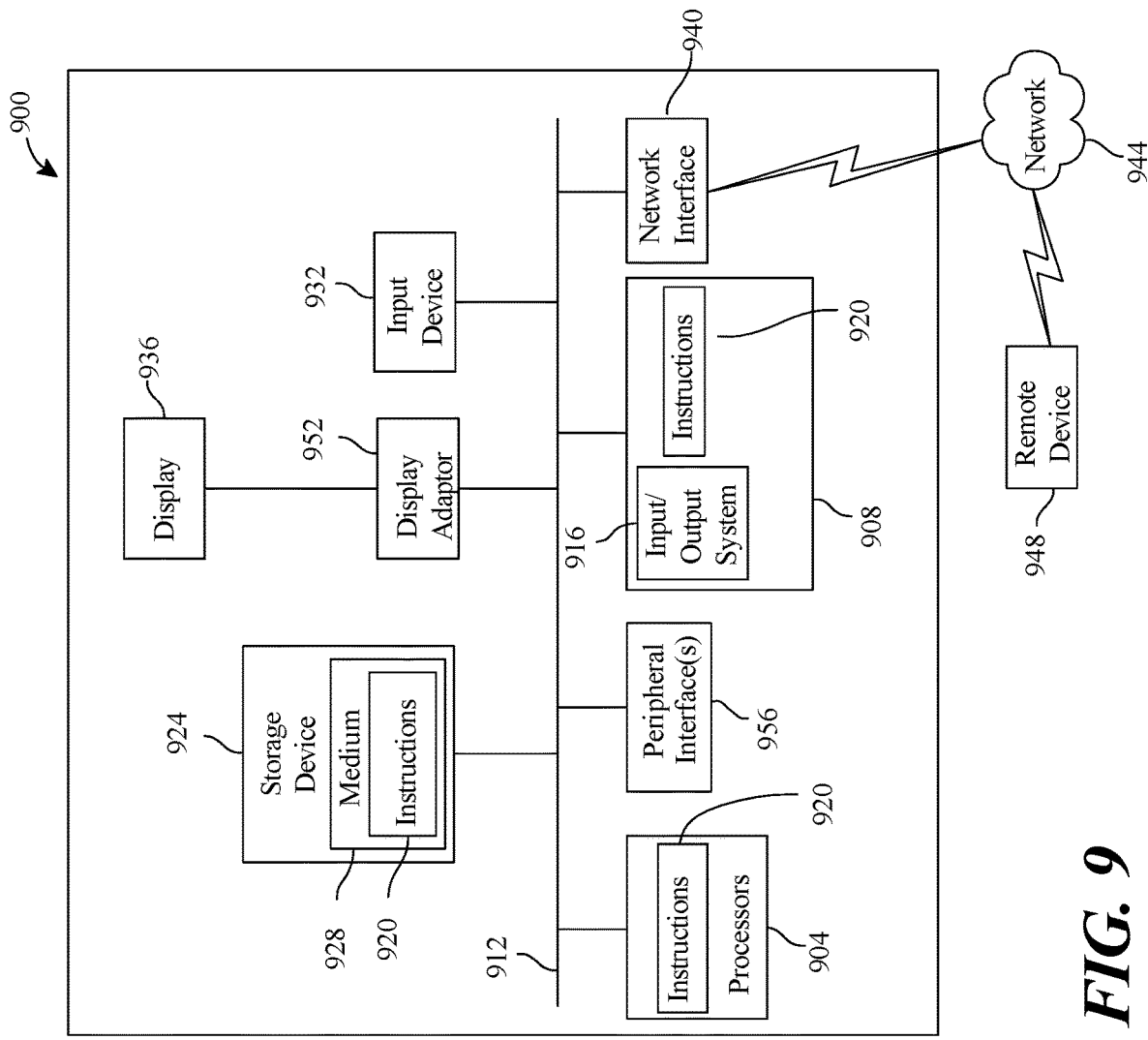
FIG. 9 is a block diagram of a computing system that can be used to implement any one or more of the methodologies disclosed herein and any one or more portions thereof in one or more aspects of the present disclosure.

FIG. 9 shows a diagrammatic representation of one embodiment of a computing device in the exemplary form of a computer system 900 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 900 includes a processor 904 and a memory 908 that communicate with each other, and with other components, via a bus 912. Bus 912 may include any of several types of bus structures including, but not limited to, a memory bus, a memory controller, a peripheral bus, a local bus, and any combinations thereof, using any of a variety of bus architectures.

Processor 904 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 904 may be organized according to Von Neumann and/or Harvard architecture as a non-limiting example. Processor 904 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 908 may include various components (e.g., machine-readable media) including, but not limited to, a random-access memory component, a read only component, and any combinations thereof. In one example, a basic input/output system 916 (BIOS), including basic routines that help to transfer information between elements within computer system 900, such as during start-up, may be stored in memory 908. Memory 908 may also include (e.g., stored on one or more machine-readable media) instructions (e.g., software) 920 embodying any one or more of the aspects and/or methodologies of the present disclosure. In another example, memory 908 may further include any number of program modules including, but not limited to, an operating system, one or more application programs, other program modules, program data, and any combinations thereof.

Computer system 900 may also include a storage device 924. Examples of a storage device (e.g., storage device 924) include, but are not limited to, a hard disk drive, a magnetic disk drive, an optical disc drive in combination with an optical medium, a solid-state memory device, and any combinations thereof. Storage device 924 may be connected to bus 912 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 924 (or one or more components thereof) may be removably interfaced with computer system 900 (e.g., via an external port connector (not shown)). Particularly, storage device 924 and an associated machine-readable medium 928 may provide nonvolatile and/or volatile storage of machine-readable instructions, data structures, program modules, and/or other data for computer system 900. In one example, software 920 may reside, completely or partially, within machine-readable medium 928. In another example, software 920 may reside, completely or partially, within processor 904.

Computer system 900 may also include an input device 932. In one example, a user of computer system 900 may enter commands and/or other information into computer system 900 via input device 932. Examples of an input device 932 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 932 may be interfaced to bus 912 via any of a variety of interfaces (not shown) including, but not limited to, a serial interface, a parallel interface, a game port, a USB interface, a FIREWIRE interface, a direct interface to bus 912, and any combinations thereof. Input device 932 may include a touch screen interface that may be a part of or separate from display 936, discussed further below. Input device 932 may be utilized as a user selection device for selecting one or more graphical representations in a graphical interface as described above.

A user may also input commands and/or other information to computer system 900 via storage device 924 (e.g., a removable disk drive, a flash drive, etc.) and/or network interface device 940. A network interface device, such as network interface device 940, may be utilized for connecting computer system 900 to one or more of a variety of networks, such as network 944, and one or more remote devices 948 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 944, may employ a wired and/or a wireless mode of communication. In general, any network topology may be used. Information (e.g., data, software 920, etc.) may be communicated to and/or from computer system 900 via network interface device 940.

Computer system 900 may further include a video display adapter 952 for communicating a displayable image to a display device, such as display device 936. Examples of a display device include, but are not limited to, a liquid crystal display (LCD), a cathode ray tube (CRT), a plasma display, a light emitting diode (LED) display, and any combinations thereof. Display adapter 952 and display device 936 may be utilized in combination with processor 904 to provide graphical representations of aspects of the present disclosure. In addition to a display device, computer system 900 may include one or more other peripheral output devices including, but not limited to, an audio speaker, a printer, and any combinations thereof. Such peripheral output devices may be connected to bus 912 via a peripheral interface 956. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and systems according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for battery management for electric aircraft batteries, the system comprising:
    an energy storage system configured to provide energy to the electric aircraft via a power supply connection, the energy storage system comprising:
        a battery pack;
        a sensor configured to detect a condition parameter of the battery pack and generate a battery datum based on the condition parameter;
        a pack monitoring unit (PMU) configured to receive the battery datum, wherein the PMU is further configured to determine a critical event element,
            wherein determining the critical event element comprises:
                identifying an operating condition of the battery pack as a function of the battery datum; and
                comparing the operating condition to a predetermined threshold; and
        a high voltage disconnect configured to terminate the power supply connection between the battery pack and the electric aircraft;
        a high voltage bus electrically connected to the high voltage disconnect; and
        a first controller area network (CAN) bus and a second CAN bus communicatively connected to the PMU, the high voltage bus, and the primary functional display;
            wherein the first CAN bus is configured to electrically isolate from the second CAN bus.

2. The system of claim 1, wherein the battery pack comprises a plurality of battery sub-packs.

3. The system of claim 2, wherein the system further comprises a flight controller configured to control which of the plurality of battery packs provides energy to the electric aircraft.

4. The system of claim 1, wherein PMU comprises a first PMU and a second PMU, wherein the first PMU is communicatively connected to the first CAN bus and the second PMU is communicatively connected to the second CAN bus.

5. The system of claim 4, wherein the system further comprises a recharge controller communicatively connected to the first CAN bus and the second CAN bus.

6. The system of claim 5, wherein the recharge controller is configured to receive battery datum from the first PMU and the second PMU.

7. The system of claim 5, wherein the recharge controller is configured to control an operating state of a charger based on battery datum.

8. The system of claim 1, wherein the first CAN bus is configured to connect to the second CAN bus by a tie breaker.

9. The system of claim 1, wherein the electric aircraft is an electric vertical takeoff and landing (eVTOL) aircraft.

10. The system of claim 1, wherein the energy storage system comprises a plurality of battery packs.

11. A method for battery management for electric aircraft batteries, comprising:
    receiving, at a first pack monitoring unit (PMU) from a first sensor on a battery pack, a first battery datum based on a first condition parameter of the battery pack, the PMU configured to determine a critical event element, wherein determining the critical event element comprises:
        identifying an operating condition of the battery pack as a function of the battery datum; and
        comparing the operating condition to a predetermined threshold;
    transmitting the first battery datum from the first PMU to a first flight controller;
    transmitting the first battery datum from the first flight controller to a primary functional display; and
    displaying the first battery datum on the primary functional display.

12. The method of claim 11, wherein the first PMU and the first flight controller are communicatively connected by a first CAN bus.

13. The method of claim 12, wherein the first CAN bus is communicatively connected to a plurality of battery packs.

14. The method of claim 13, wherein the first flight controller is configured to control which of the plurality of battery packs provides energy to an electric aircraft.

15. The method of claim 13, wherein the method further comprises receiving, at a second PMU from a second sensor on the battery pack, a second battery datum based on a second condition parameter of the battery pack.

16. The method of claim 15, wherein the method further comprises transmitting the second battery datum from the first PMU to a second flight controller.

17. The method of claim 16, wherein the second PMU and the second flight controller are communicatively connected by a second CAN bus.

18. The method of claim 17, wherein the first CAN bus is configured to connect to the second CAN bus by a tie breaker.

19. The method of claim 18, wherein a high voltage bus electrically connects the battery pack to the first CAN bus and the second CAN bus.

20. The method of claim 11, wherein the electric aircraft is an electric vertical takeoff and landing (eVTOL) aircraft.

* * * * *